(12) United States Patent
Huang et al.

(10) Patent No.: US 8,193,472 B2
(45) Date of Patent: Jun. 5, 2012

(54) SUSCEPTOR

(75) Inventors: Yi Cheng Huang, Azumino (JP);
Kazuyuki Fukuda, Azumino (JP);
Yasuhisa Sato, Azumino (JP); Gaku Kumai, Azumino (JP)

(73) Assignee: Nihon Dennetsu Co., Ltd., Nagano (JP)

( * ) Notice: Subject to any disclaimer, the term of this patent is extended or adjusted under 35 U.S.C. 154(b) by 1063 days.

(21) Appl. No.: 12/076,729

(22) Filed: Mar. 21, 2008

(65) Prior Publication Data

US 2008/0230535 A1    Sep. 25, 2008

(51) Int. Cl.
*H05B 3/68* (2006.01)
*H05B 3/44* (2006.01)

(52) U.S. Cl. .................... 219/444.1; 219/544

(58) Field of Classification Search .... 219/443.1–468.2, 219/544–548; 403/281, 282
See application file for complete search history.

(56) References Cited

U.S. PATENT DOCUMENTS

| 1,989,955 | A | * | 2/1935 | Van Patter | 403/281 |
| 2,987,300 | A | * | 6/1961 | Greene | 165/169 |
| 3,482,865 | A | * | 12/1969 | Haller | 403/282 |
| 6,147,334 | A | * | 11/2000 | Hannigan | 219/544 |
| 6,552,311 | B2 | * | 4/2003 | Watanabe | 219/538 |
| 6,835,917 | B2 | * | 12/2004 | Shin | 219/444.1 |

FOREIGN PATENT DOCUMENTS

| JP | 2002-270347 A | 9/2002 |
| WO | 2007/126228 A1 | 11/2007 |

* cited by examiner

*Primary Examiner* — Sang Paik
(74) *Attorney, Agent, or Firm* — Kubovcik & Kubovcik

(57) ABSTRACT

A susceptor [1] is manufactured by providing a protruding part [8] on the joining surface of a retainer plate [4], and additionally providing a groove part [9] composed of a dovetail groove on the joining surface of a heat transfer plate [3] in a position facing the protruding part [8]. By fitting the protruding part [8] into the groove part [9] and caulking, the heat transfer plate [3] and the retainer plate [4] are conjoined.

12 Claims, 33 Drawing Sheets

SUSCEPTOR

BACKGROUND OF THE INVENTION

1. Field of the Invention

The present invention relates to susceptors for heat treating or cooling a substrate, and more particularly, to a susceptor used in a substrate heat treatment device that heat treats or cools substrates such as semiconductor wafers and LCD glass as part of the manufacturing process of semiconductor elements and LCD panels.

2. Description of the Related Art

In the manufacturing process of semiconductor elements and LCD panels, heat treatment and cooling of a substrate [31] such as a semiconductor wafer or LCD glass is carried out using a substrate heat treatment device [30] like that shown in FIG. 33. In this substrate heat treatment device [30], a susceptor [32] that heats or cools the substrate [31] is structured such that a heat source or cooling source [33] is conjunctively inserted between a heat transfer plate [34] and a retainer plate [35]. Materials having outstanding thermal conductivity, such as aluminum, aluminum alloys, copper and copper alloys, are used as materials for the heat transfer plate [34] and the retainer plate [35]. The heat transfer plate [34] and the retainer plate [35] are conjoined by welding or soldering the outer peripheries thereof. However, because pinholes or enclosed gas are generated at this time, there is the problem that the strength of the conjoined portion is decreased. Furthermore, when the interior of the substrate heat treatment device [30] is made to be a vacuum, there is the problem that gas leaks from the pinholes, thus lowering the vacuum level and exerting a deleterious effect on the heat treatment of the substrate [31].

In order to resolve these problems, Patent Literature 1 proposes a susceptor in which a protruding ring part and a groove part are provided facing each other on the joining surfaces of the heat transfer plate and the retainer plate. These parts are then combined and joined by press forging.

However, because the protruding ring part and the groove part are simple in shape, there is the problem that it is difficult to improve the airtightness of the susceptor to the degree that would allow heat treatment in a high vacuum or in a liquid. There is also the additional problem that because press forging is conducted by raising the temperature to near that of the temperature of the heating area used as the heater plate (for example, 400° C.), there is the likelihood that the materials of the heat transfer plate and the retainer plate will deform, thereby causing the structure and the characteristics of the susceptor to change. Such change additionally requires special equipment and operations, resulting in higher manufacturing costs.

Patent Literature 1: Japanese Unexamined Patent Application Publication No. 2002-270347

BRIEF SUMMARY OF THE INVENTION

The object of the invention is to provide a susceptor that has improved airtightness, does not deform during manufacturing or change characteristics, and whose manufacturing costs are reduced.

Consequently, this invention is a susceptor with a substrate heating means or substrate cooling means inserted between a first metal plate and a second metal plate. The susceptor has a protruding part having a concave portion provided upon the joining surface of the first plate, and a groove part composed of a dovetail groove provided upon the joining surface of the second plate opposite to the protruding part. By fitting the protruding part into the groove part, the first plate and the second plate are conjoined.

As a result of the susceptor of this invention, the protruding part is plastically deformed and embedded into the groove part so that they are mutually secured, while in addition both walls of the concave portion are spread open and inserted into the wide portion on the bottom surface of the groove part to form a labyrinth. Consequently, the airtightness of the susceptor is improved. Furthermore, because it is possible to caulk using a general pressing machine at room temperature, at manufacturing time there is no deformation in the susceptor nor do its characteristics change, and manufacturing costs can be decreased.

DETAILED DESCRIPTION OF THE INVENTION

Figure 1:
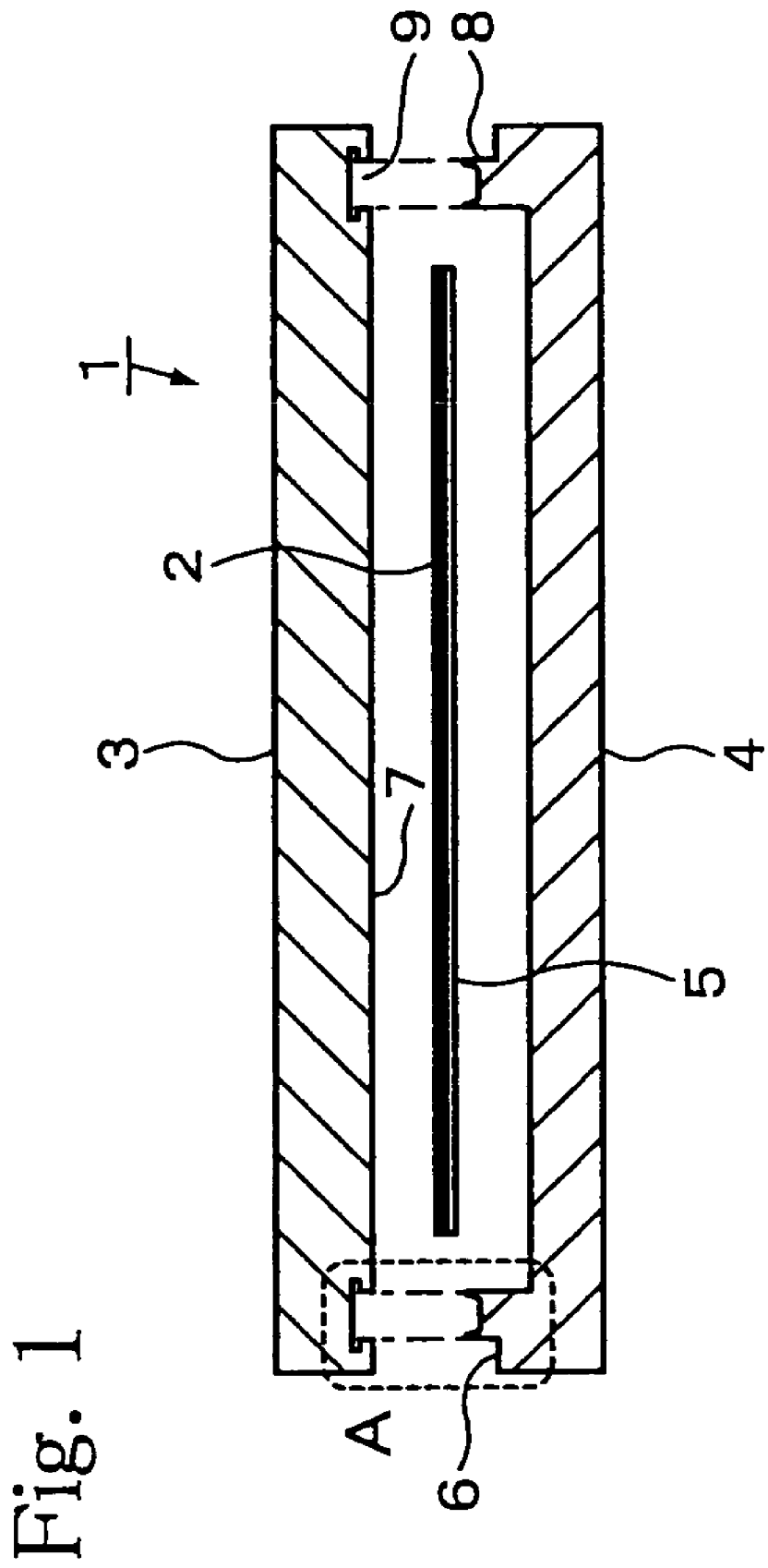
FIG. 1 is a structural end view diagram of the susceptor comprising the first embodiment of this invention.

FIG. 1 shows a structural end view diagram of the susceptor comprising the first embodiment of this invention.

This susceptor [1] is composed of a planar heater [2], which is the substrate heat source, the heater being inserted between and held from above and below by a second plate (specifically, the heat transfer plate [3]) and a first plate (specifically, the retainer plate [4]), and the plates being conjoined at a joining portion A. A metal foil heater or a mica-wrapped heater is used in the planar heater [2], being secured to the joining surface [7] of the heat transfer plate [3] by a thermal shield plate [5] and a screw (not shown in the diagram). Materials having outstanding heat conduction properties, such as aluminum, aluminum alloys, copper, and copper alloys, are used as the materials for the heat transfer plate [3] and the retainer plate [4]. The substrate, being a semiconductor wafer or LCD glass, is mounted directly onto the heat transfer plate [3] or via a plurality of proximity pins (not shown in the diagram). Heat treatment is carried out by the planar heater [2] through the heat transfer plate [3]. Consequently, the planar shape of the susceptor [1] is round when the substrate is a semiconductor wafer, and rectangular when the substrate is LCD glass.

In this type of susceptor [1], the joining portion A is composed of a protruding part [8] provided in a ring along the periphery of the joining surface [6] of the retainer plate [4], as well as a groove part [9] provided in a ring on the joining surface [7] of the heat transfer plate [3] that faces the protruding part [8].

Figure 2:
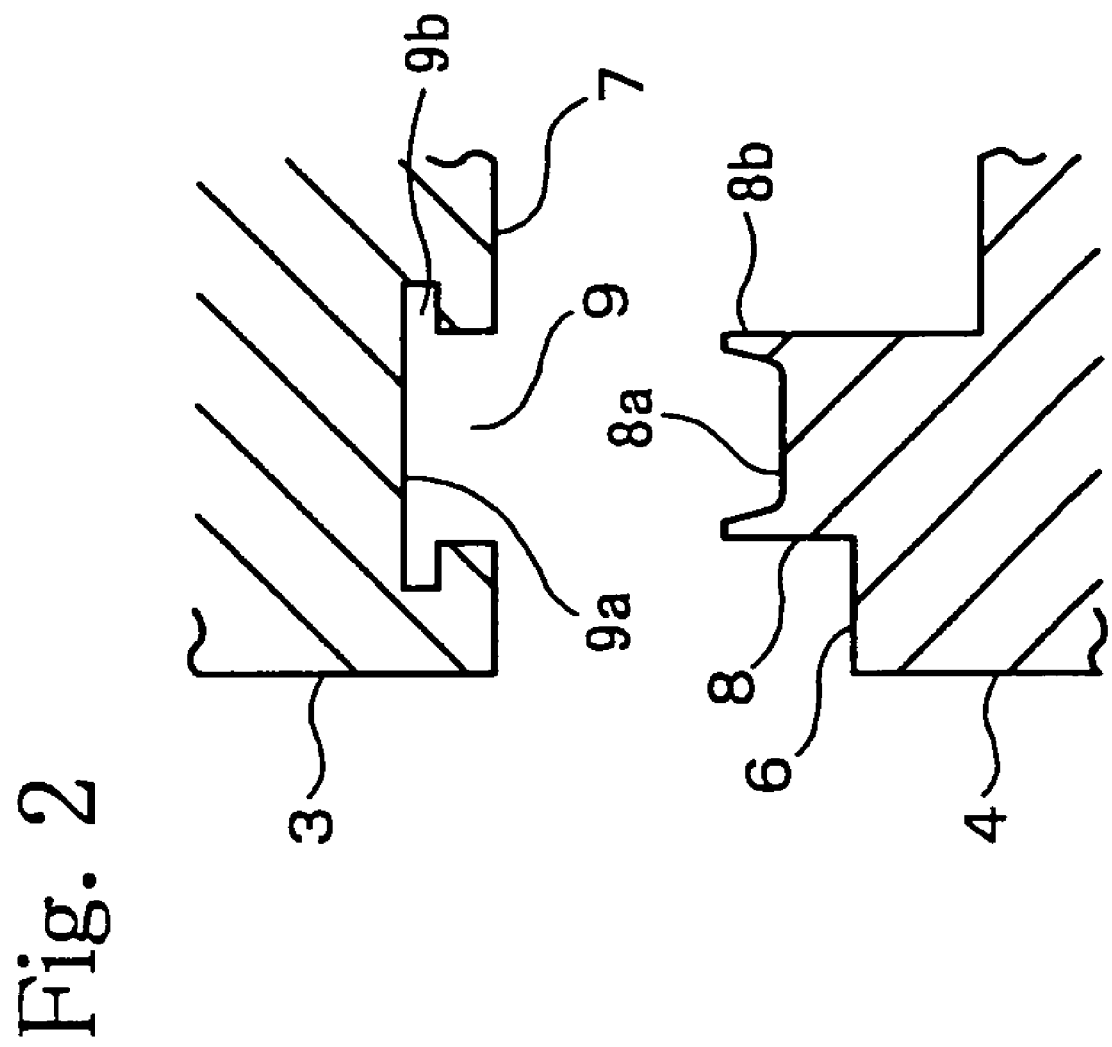
FIG. 2 is an expanded end view diagram of the joining portion A shown in FIG. 1.
Figure 3:
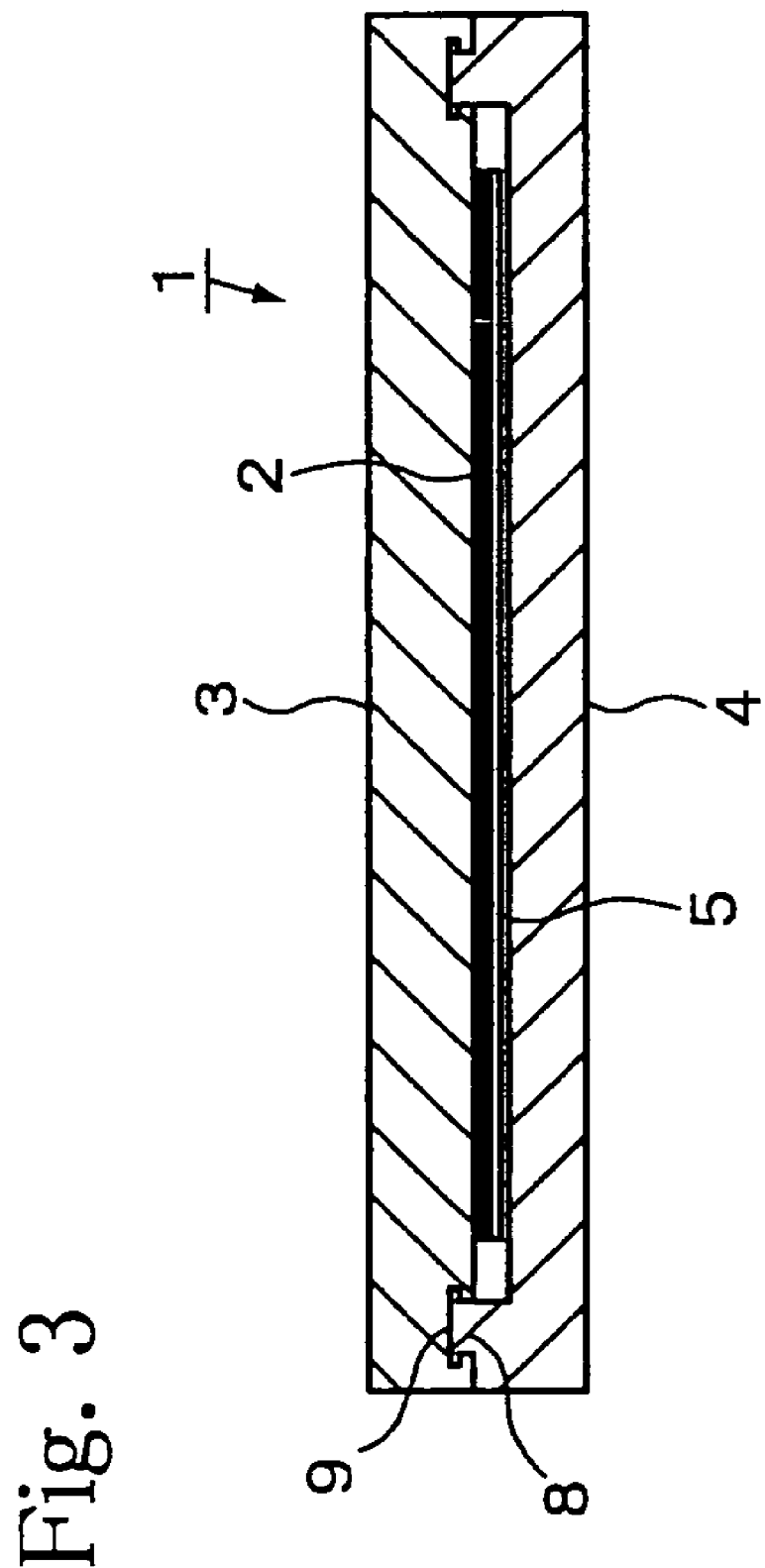
FIG. 3 is a cross-sectional diagram of the susceptor comprising the first embodiment of this invention.

As shown in FIG. 2, the cross-section of the protruding part [8] of the retainer plate [4] is spork-shaped, having two wall parts [8b] as a result of a concave portion [8a] being formed on the upper surface thereof. In addition, the groove part [9] of the heat transfer plate [3] is a dovetail groove whose cross-section is shaped approximately like the letter T and having a wide portion [9b] on the bottom surface [9a] thereof. By having this protruding part [8] fitted into the groove part [9] and pressure caulked in the vertical direction, the heat transfer plate [3] and the retainer plate [4] are conjoined to produce the susceptor shown in FIG. 3.

Figure 4:
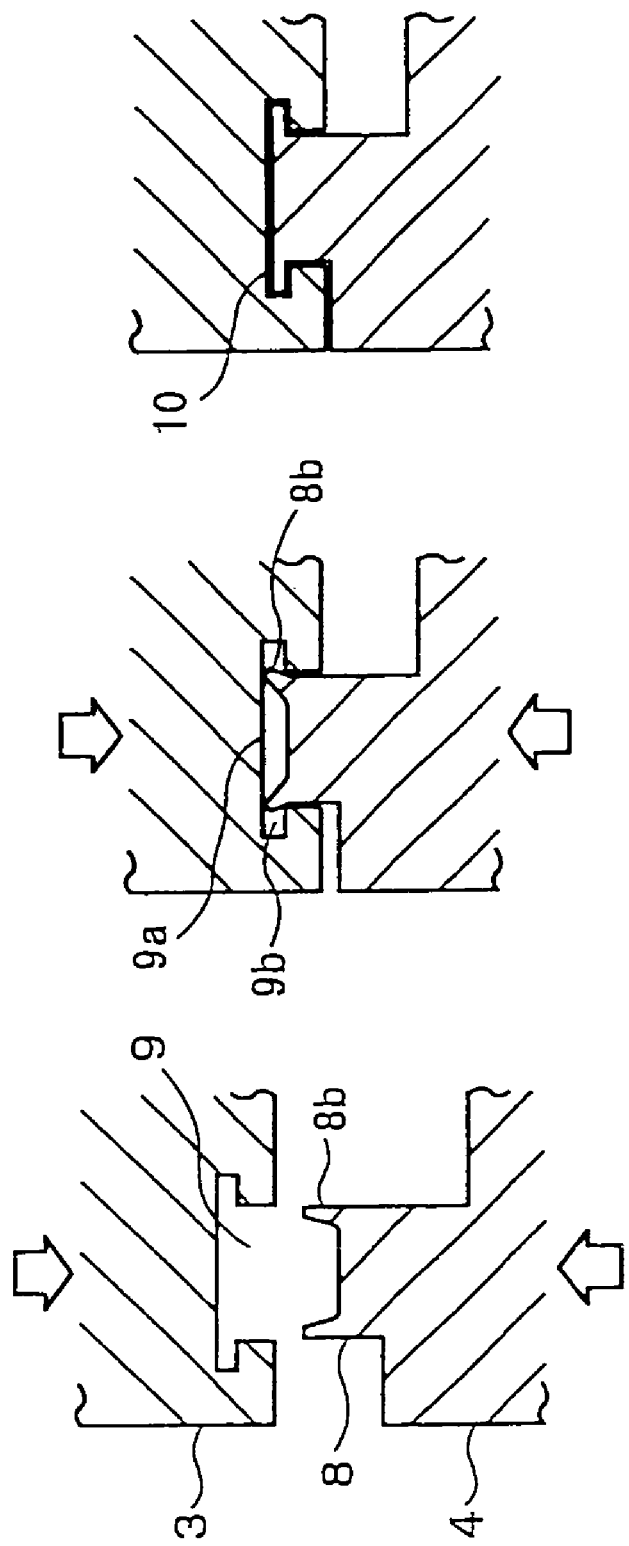
FIG. 4 is an explanatory diagram illustrating the action of the joining portion A shown in FIG. 1.

To explain this joining process in detail, when the protruding part [8] is fitted into the groove part [9] and pressure is added after they are mutually brought together as shown in FIG. 4 (A), the protruding part [8] is plastically deformed by being compacted and pressed against the bottom surface [9a] of the groove part [9] as shown in FIG. 4 (B). In addition, the wall parts [8b] are spread outward and inserted into the wide portion [9b] of the groove part [9], and the groove part [9] is filled by and joined to the protruding part [8] as shown in FIG. 4 (C). In addition, the shape of the gas passage in the radial direction becomes irregular, and a "labyrinth" [10] is formed.

In this manner, the susceptor [1] is made by conjoining the heat transfer plate [3] and the retainer plate [4] by fitting and caulking the protruding part [8], formed by the concave portion [8a] on the upper surface of the retainer plate [4], into the groove part [9] composed of a dovetail groove. For this reason, the plates are mutually secured by plastically deforming the protruding part [8] and filing the groove part [9] therewith. In addition, since the labyrinth [10] is formed radially, the airtightness of the susceptor [1] can be improved. Furthermore, because it is possible to carry out caulking at room temperature using a general press machine, the susceptor [1] is not deformed nor do its characteristics change, and manufacturing costs are also decreased. Additionally, since a labyrinth is formed at the joining portion A, it is possible to obtain a highly airtight seal, even if the height of the protruding part [8] and the depth of the groove part [9] are small. Not only does this facilitate the processing of the protruding part [8] and the groove part [9], it is possible to lower manufacturing costs even further because the manufacturing of the susceptor can be carried even in narrow spaces.

Figure 5:
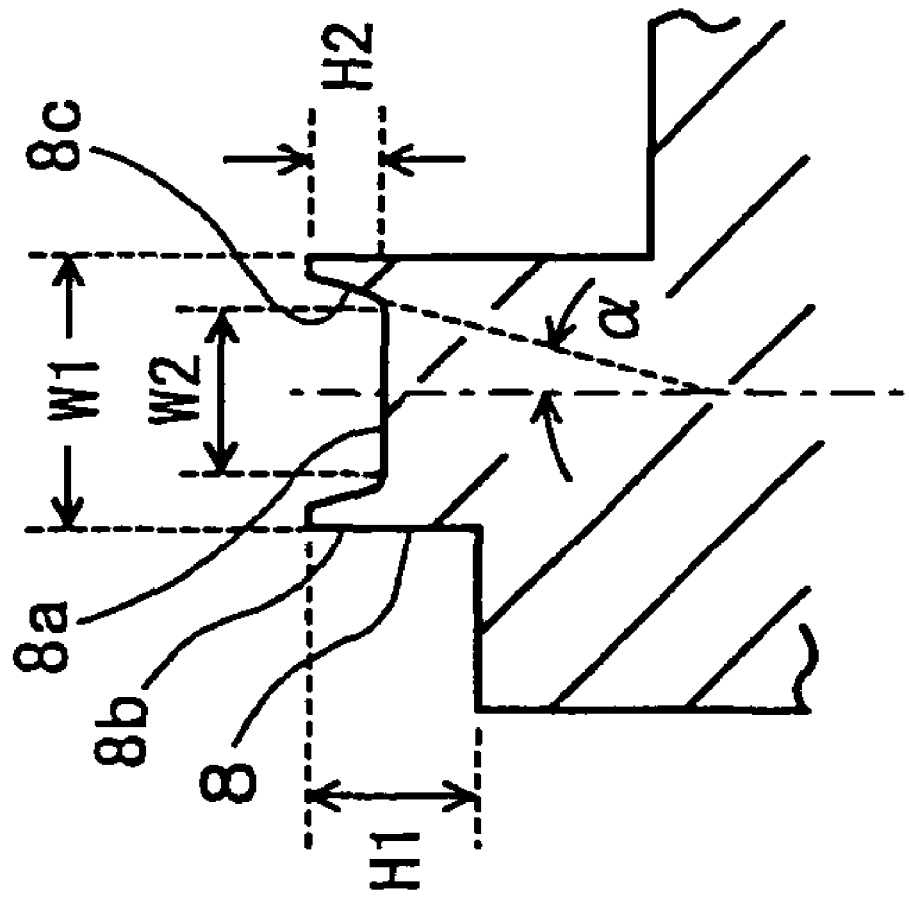
FIG. 5 is an explanatory diagram showing the shape dimensions of the protruding part of the susceptor comprising the first embodiment of this invention.
Figure 6:
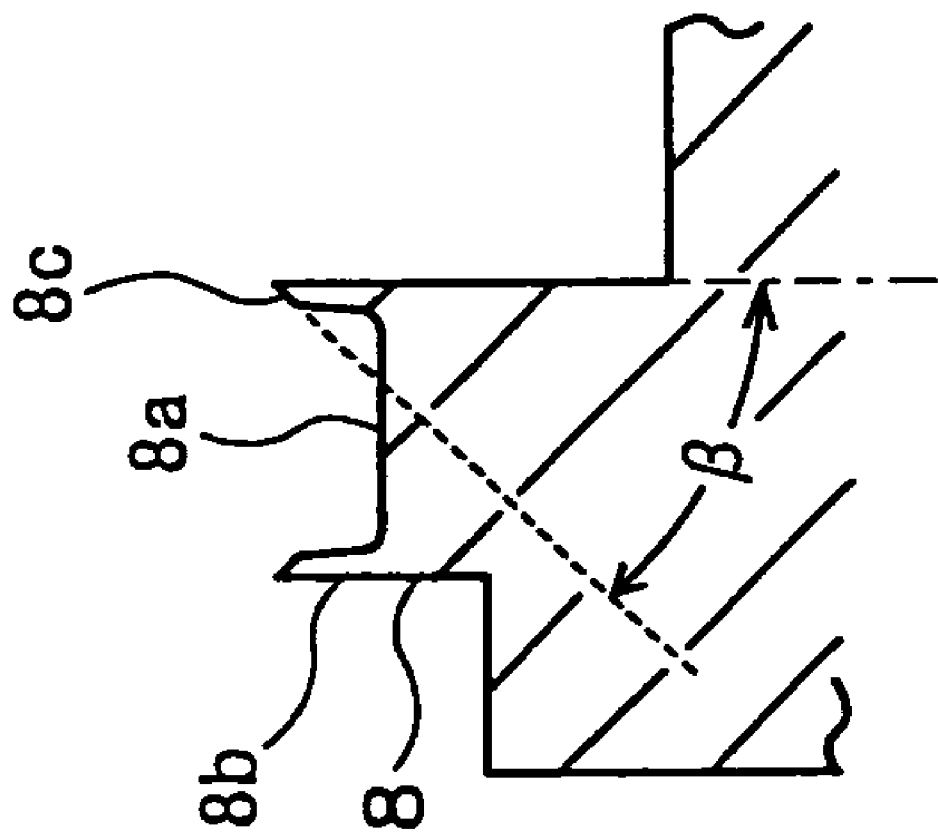
FIG. 6 is an explanatory diagram showing the shape dimensions of a modification of the protruding part of the susceptor comprising the first embodiment of this invention.

As shown in FIG. 5, it is preferable if the bottom surface width [W2] of the concave portion [8a] of the protruding portion [8] is 0.4 to 0.8 times the total width [W1]. When less than 0.4, the wall parts [8b] become too thick and spreading them out becomes difficult. When over 0.8, the wall parts [8b] become too thin and there is increased concern that they will fracture. Furthermore, in addition to reducing concerns about the wall parts [8b] fracturing, in order to make insertion into the wide portion [9b] of the groove part [9] easier, a taper [8c] is formed on the inner side of the wall parts [8b], having a tapered shape and forming an angle α between 5° and 45°, more preferably between 5° and 30°, with respect to the vertical direction of the taper [8c]. Additionally, when the bottom surface width [W2] exceeds 0.8 with respect to the total width [W1], as shown in FIG. 6, it is permissible for the taper [8c] to be formed only on the tips of the wall parts [8b], forming an angle β from the vertical direction of the taper [8c] that is between 10° and 80°, and more preferably between 15° and 60°.

Figure 7:
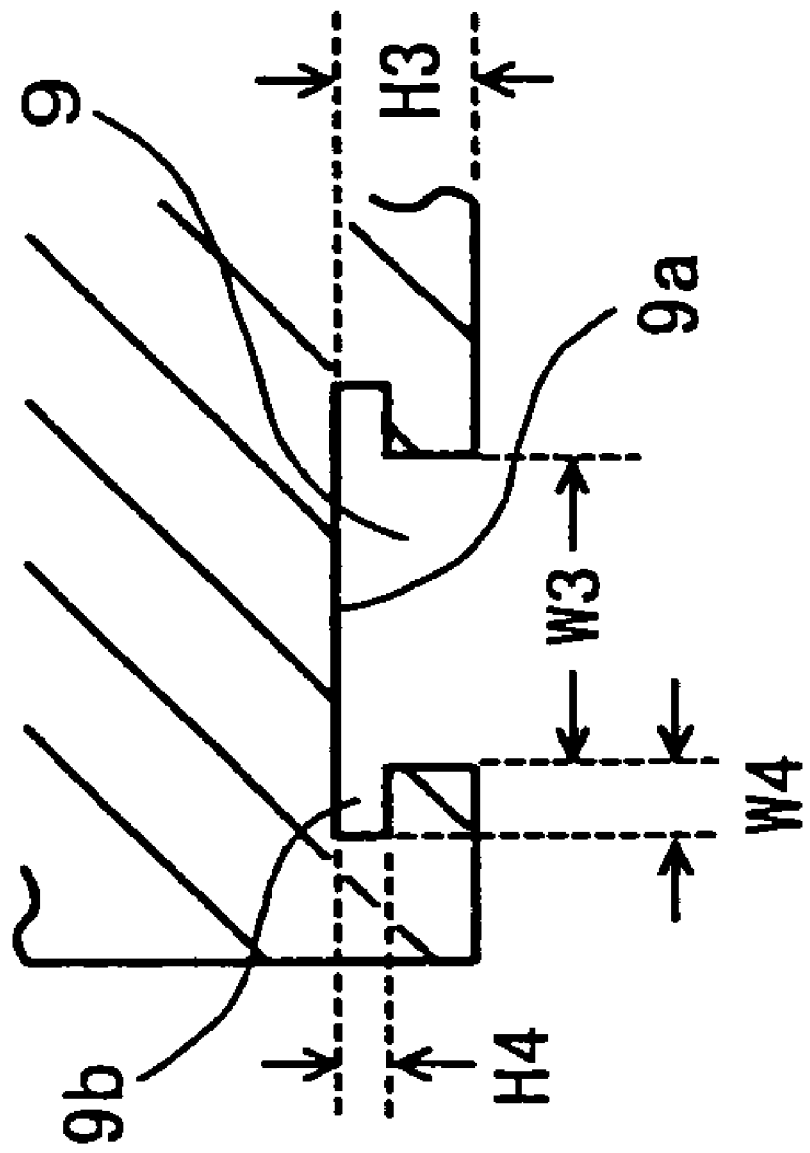
FIG. 7 is an explanatory diagram showing the shape dimensions of the groove part of the susceptor comprising the first embodiment of this invention.

Moreover, with regard to the groove part [9], in order to be able to fit the protruding part [8] thereinto, it is preferable if the aperture width [W3] shown in FIG. 7 is slightly larger than the total width [W1] of the protruding part [8]. Furthermore, in order to fill at least 90% of the interior volume of the groove part with the protruding part [8] after caulking, it is preferable to set the depth [H2] of the concave portion [8a] and the total height [H1] of the protruding part [8], and to set the total depth [H3] and the aperture width [W3] of the groove part [9]. In particular, it is preferable to set the height [H4] and the depth [W4] of the wide portion [9b] such that the wide portion [9b] in the groove part [9] is completely filled in by the wall parts [8b] of the protruding part [8].

Figure 8:
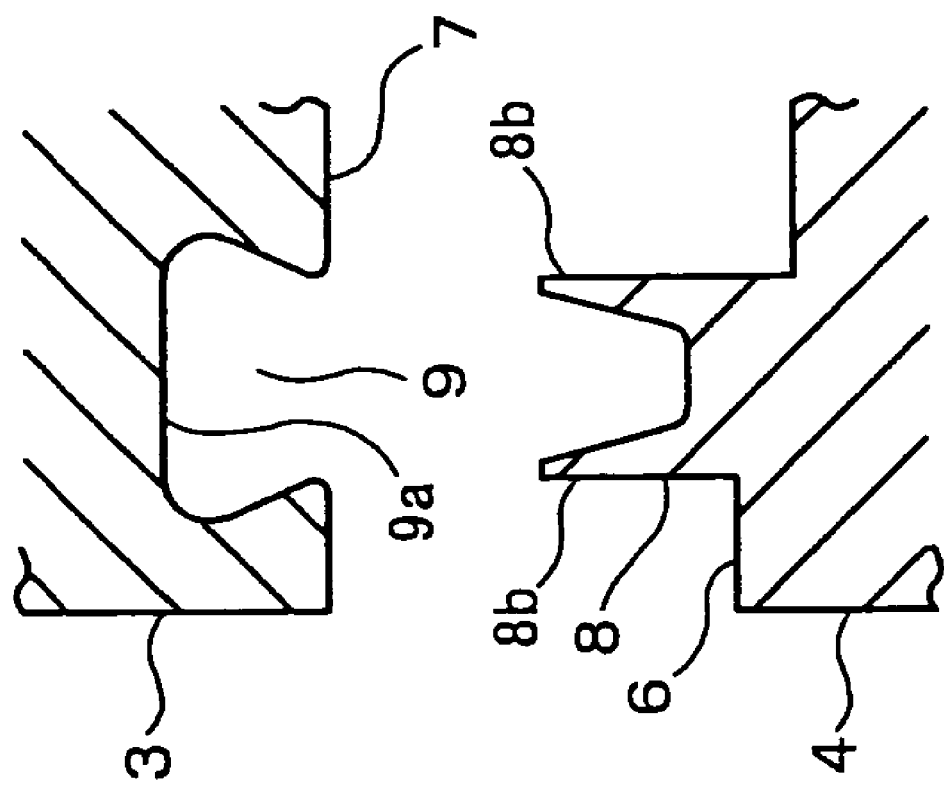
FIG. 8 is an expanded end view diagram of the joining portion of the susceptor comprising the second embodiment of this invention.

FIG. 8 shows the joining portion of the susceptor comprising the second embodiment of this invention.

In this embodiment, in addition to the cross-section of the groove part [9] assuming an inverted trapezoidal shape (table-like shape), the height of the wall parts [8b] of the protruding part [8] is increased.

Figure 9:
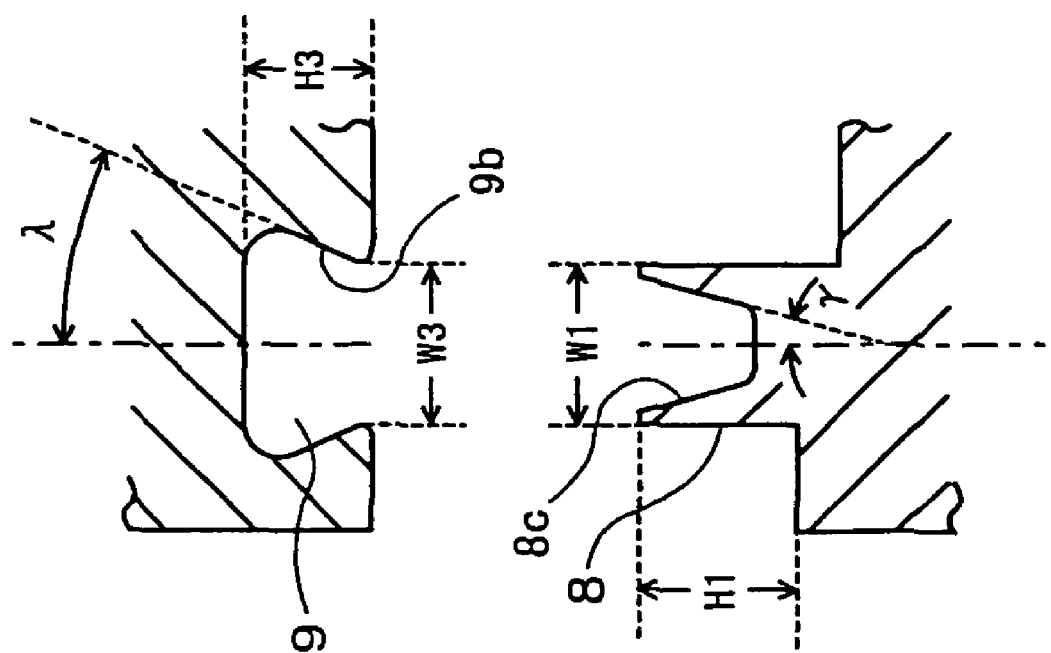
FIG. 9 is an explanatory diagram showing the shape dimensions of the protruding part and the groove part of the susceptor comprising the second embodiment of this invention.

As shown in FIG. 9, it is preferable to set the dimensions of the width [W1] and the total height [H1] of the protruding part [8], as well as the aperture width [W3] and the total depth [H3] of the groove part [9], such that 60% to 80% of the volume of the groove part [9] after caulking is filled by the protruding part [8]. It is also preferable to set the width [W1] slightly smaller than the aperture width [W3]. Doing the above ensures that the joint will be fully and firmly caulked. Furthermore, in order to increase the adhesion between the wall parts [8b] of the protruding part [8] and the slope [9b] of the groove part [9], it is preferable if the angle γ formed by the taper [8c] of the wall parts [8b] with respect to the vertical direction is slightly smaller than the angle λ formed by the slope [9b] of the groove part [9] with respect to the vertical direction. Specifically, the range may be between 10° and 45° for γ and between 20° and 45° for λ.

Figure 10:
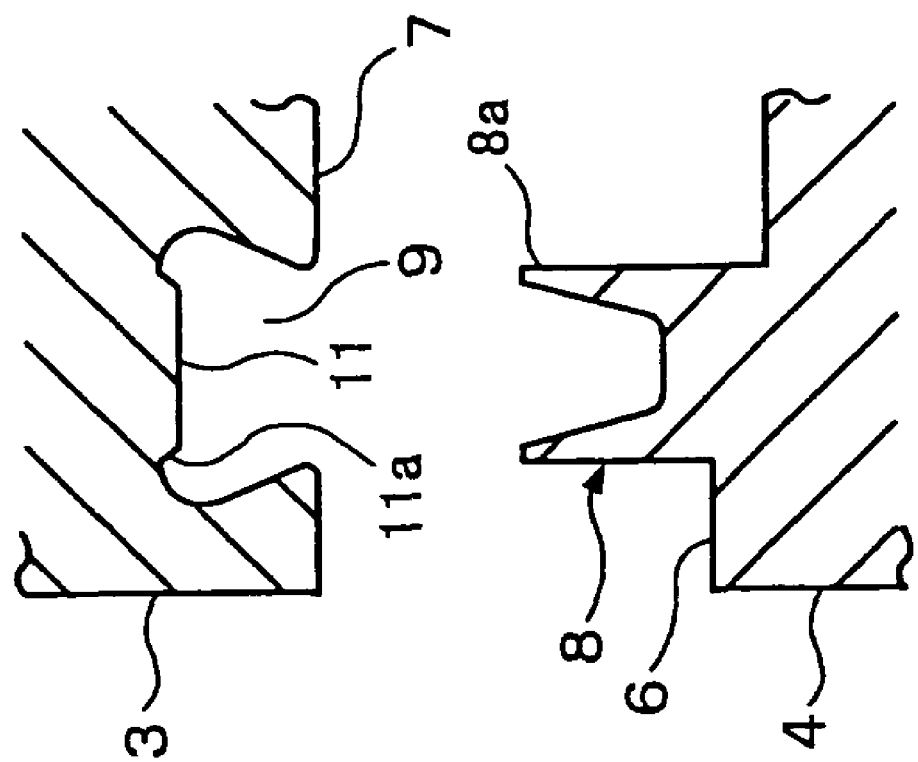
FIG. 10 is a cross-sectional diagram of a modification of the groove part of the susceptor comprising the second embodiment of this invention.

In this embodiment, as shown in FIG. 10, it is preferable to provide a convex portion [11] on a portion of the bottom surface [9a] of the groove part [9]. Additionally, it is preferable for tapers [11a] to be formed at the tips of the convex portion [11] such that the tips of the wall parts [8b] of the protruding part [8] touch these tapers [11a]. By providing a convex portion [11] on the bottom surface [9a] of the groove part [9] in this manner, it becomes possible to ensure that the spork portion [8a] of the protruding part [8] spreads out along the tapers [11a]. As a result, not only is it possible to improve the airtightness of the joining surface of the heat transfer plate [3] and the retainer plate [4], the joining process is also made simple. This type of convex portion [11] can be easily provided when forming the groove part [9] with the reverse trapezoidal shape using a lathing process.

Figure 11:
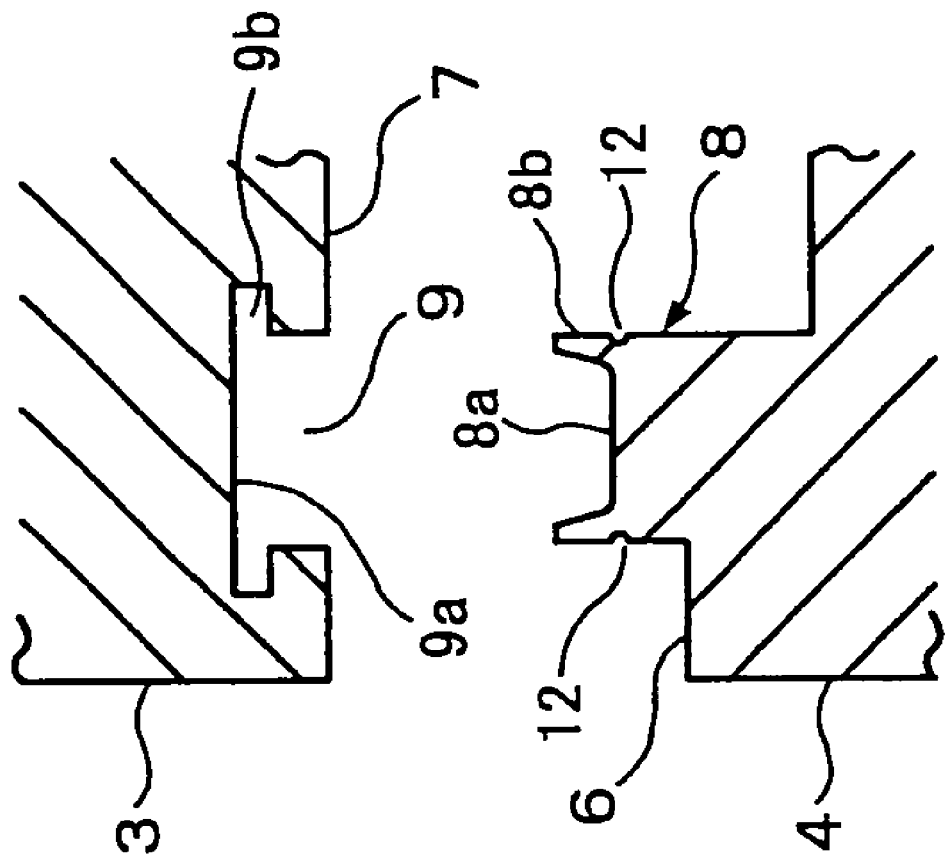
FIG. 11 is a cross-sectional diagram of a modification of the protruding part of the susceptor comprising the first embodiment of this invention.

In Embodiments 1 and 2 above, it is preferable to provide notches [12] on the periphery of the protruding part [8] corresponding to the base positions of the wall parts [8b] of the protruding part [8], as shown in FIG. 11. By providing notches [12] in this manner, the wall parts [8b] of the protruding part [8] more easily spread out at caulking time, the notches [12] acting as the edges by which the wall parts [8b] bend outward. As a result, not only is the airtightness of the joining surface of the heat transfer plate [3] and the retainer plate [4] improved, the joining process is also made simple.

Figure 12:
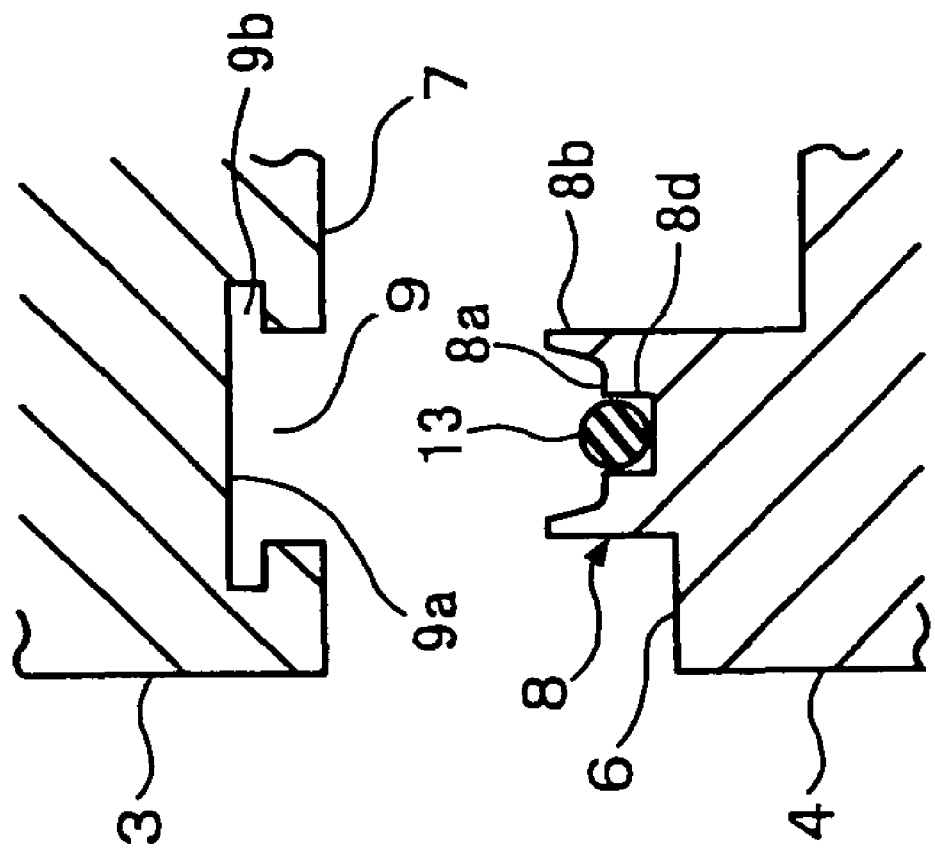
FIG. 12 is an expanded end diagram of a modification of the joining portion of the susceptor comprising the first embodiment of this invention.
Figure 13:
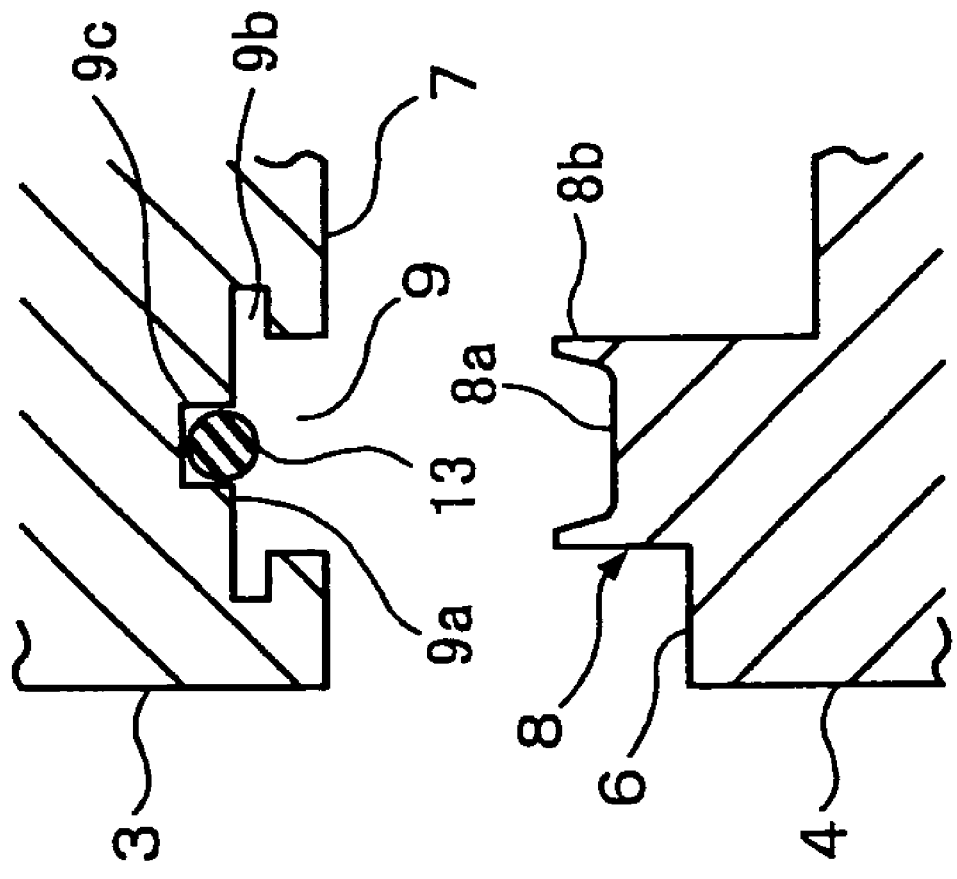
FIG. 13 is a modification of the joining portion shown in FIG. 12.
Figure 14:
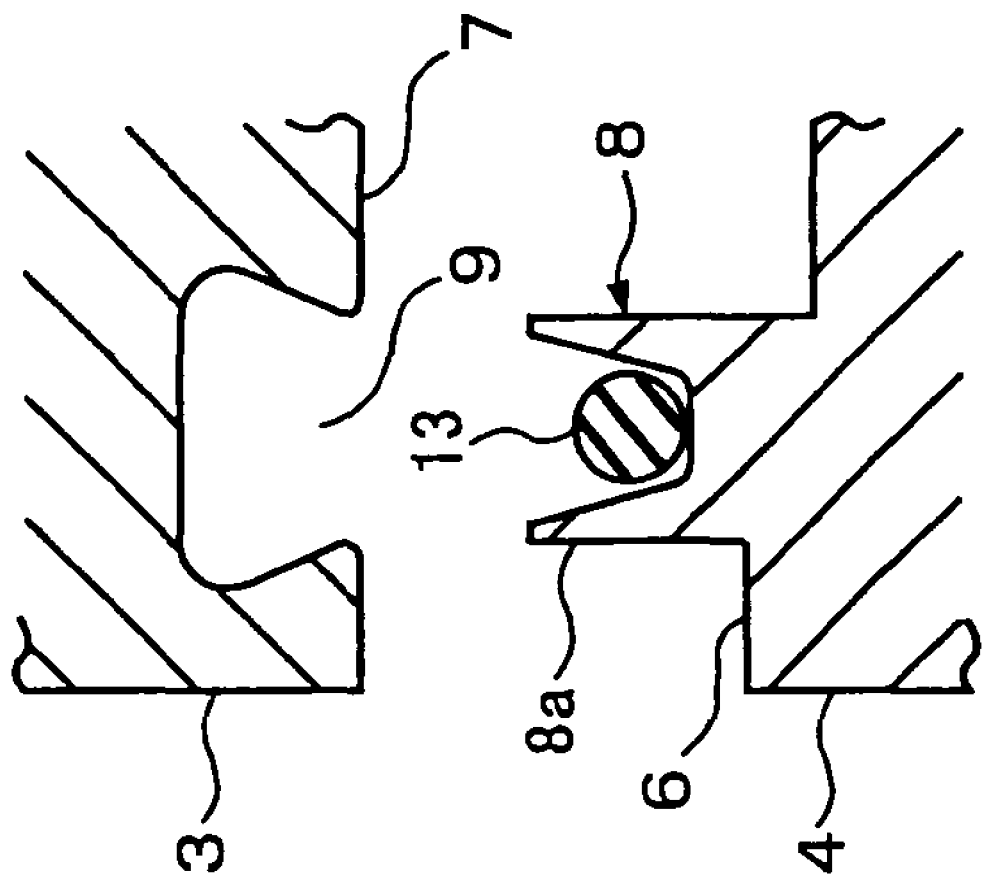
FIG. 14 is an expanded end view diagram of a modification of the joining portion of the susceptor comprising the second embodiment of this invention.

Furthermore, it is preferable if sealing material is interposed between the protruding part [8] and the groove part [9]. In the first embodiment, as shown in FIG. 12, an angled groove [8d] is formed on a portion of the bottom surface of the concave portion [8a] of the protruding part [8], the sealing material [13] disposed therein. However, as shown in FIG. 13, an angled groove [9c] may also be formed on the bottom surface [9a] of the groove part [9], the sealing material disposed therein. Additionally, in the second embodiment, as shown in FIG. 14, it is permissible to dispose the sealing material [13] between the wall parts [8b] of the protruding part [8].

Examples of the sealing material include O rings made of natural rubber, fluororubber, or silicon rubber, and metal seals made of Inconel or, stainless steel or aluminum. Also, hollow, thin walled pipe may also be used as a type of metal seal. By disposing sealing material [13] in this manner, the sealing material [13] is interposed between the protruding part [8] and the groove part after caulking, thereby filling in any gaps. As a result, it is possible to improve the airtightness of the susceptor [1], and in addition manufacturing costs can be reduced because of the additional leeway in the dimensional precision of the protruding part [8] and the groove part [9].

Figure 15:
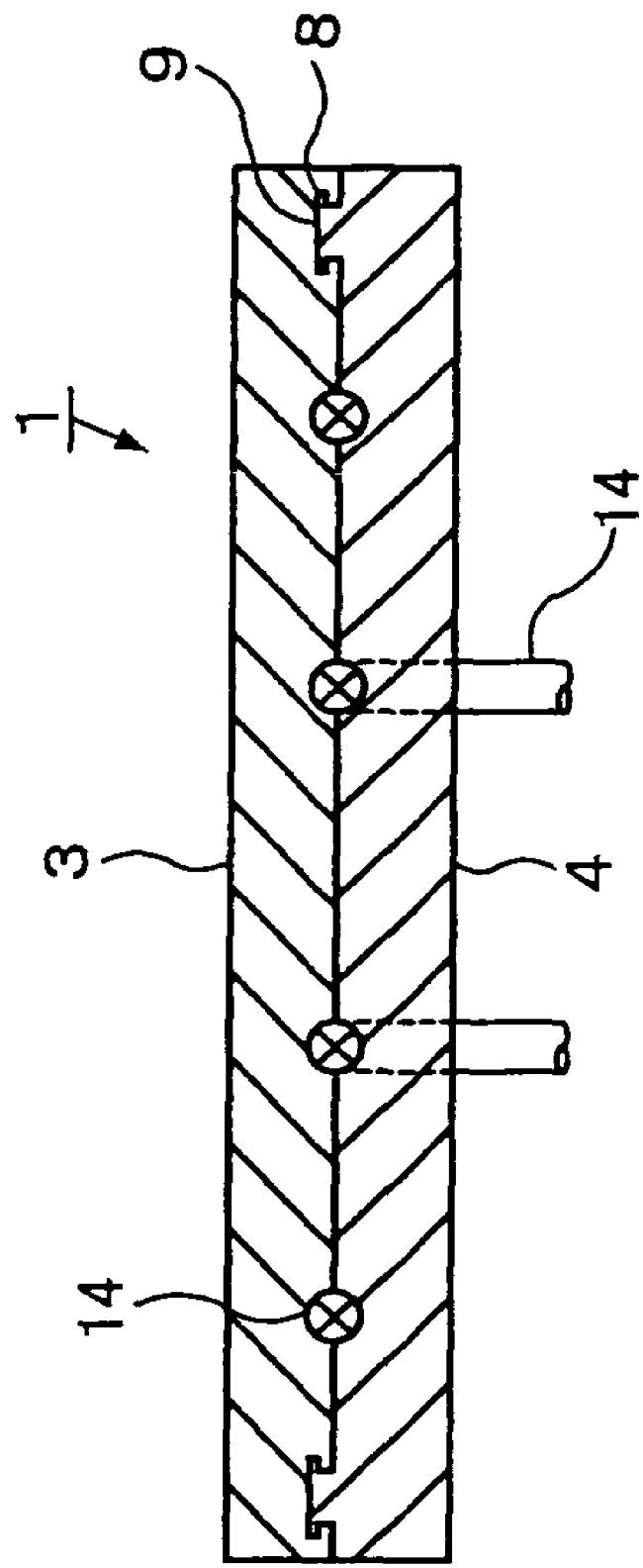
FIG. 15 is a cross-sectional diagram of the first example of the substrate heating means in the susceptor comprising the first embodiment of this invention.

The substrate heat source in Embodiments 1 and 2 above is not limited to the planar heater [2]. As shown in FIG. 15, the heat source may also be a sheath heater [14] installed in a groove portion formed at the joining surface. This sheath heater [14] passes through either the heat transfer plate [3] or the retainer plate [4], and is connected to an outside power source not shown in the diagram. Examples of the sheath material include aluminum, stainless steel and Inconel.

Figure 16:
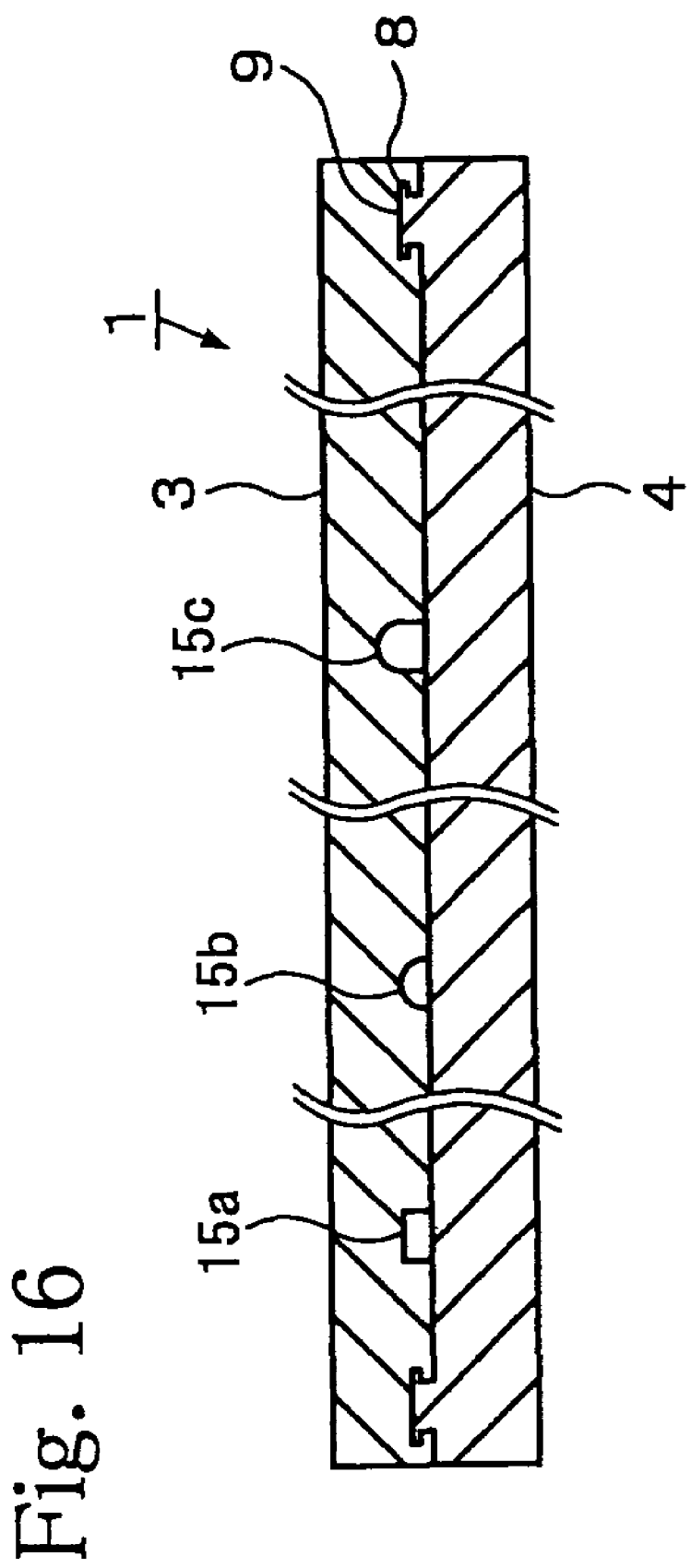
FIG. 16 is a cross-sectional diagram of the first example of the substrate cooling means in the susceptor comprising the first embodiment of this invention.
Figure 17:
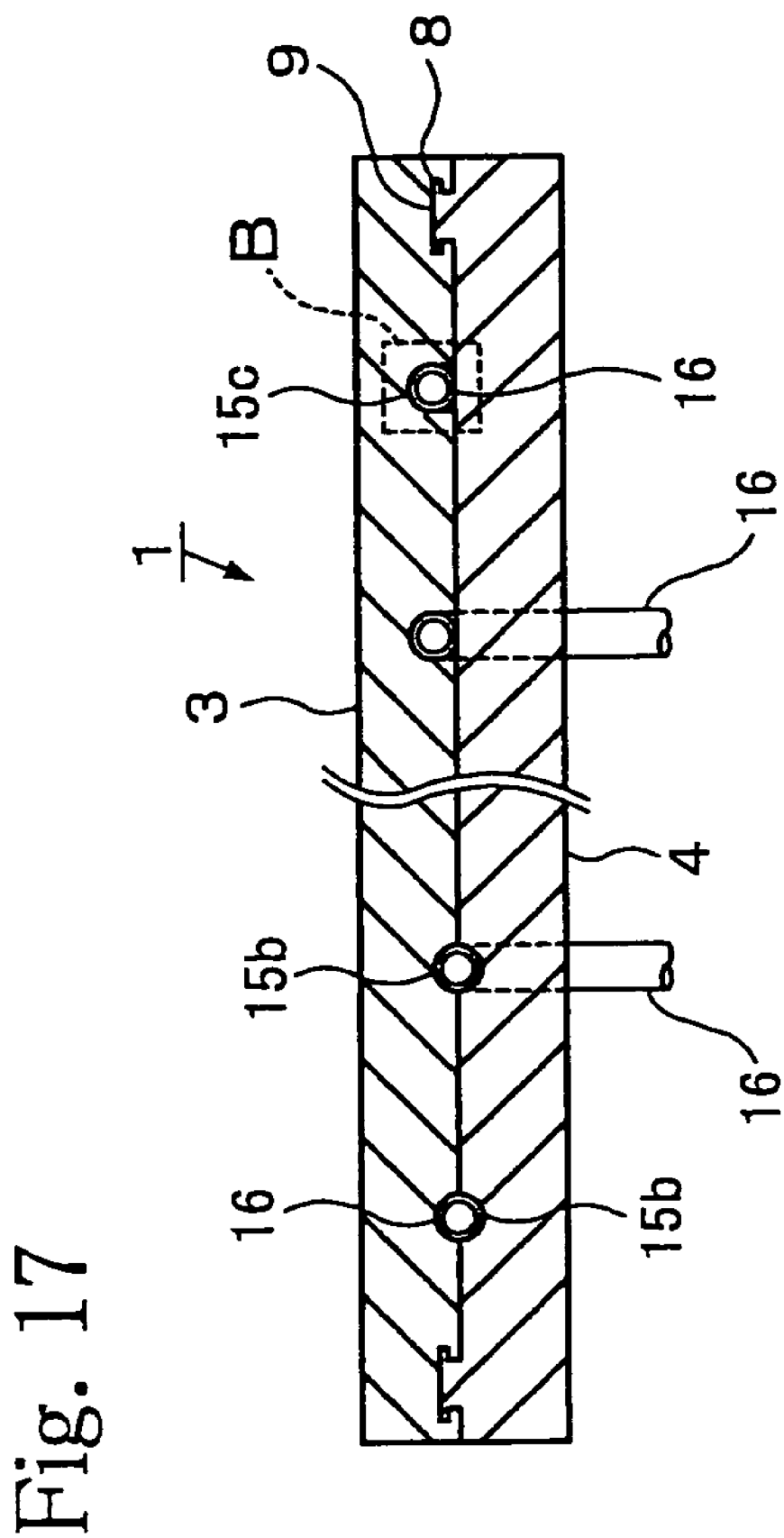
FIG. 17 is a cross-sectional diagram of the second example of the substrate cooling means in the susceptor comprising the first embodiment of this invention.

Furthermore, it is also possible to insert a substrate cooling source in place of the substrate heat source between the heat transfer plate [3] and the retainer plate [4]. The substrate cooling source may comprise channel grooves [15] as shown in FIG. 16, being formed at the joining surface of at least one of either the heat transfer plate [3] or the retainer plate [4], the cross-sectional shape of the grooves being that of an approximately rectangular groove [15a], an approximately semicircular groove [15b], an approximately U-shaped groove [15c], or a similar shape; alternatively, pipes [16] as shown in FIG. 17 may be used, the pipes being disposed in the above grooves and having coolant flowing therethrough. Examples of coolants that can be used include: gases such as air, Freon, ammonia gas, and nitrogen; and liquids such as water and fluorine family liquids (fluorinates made by 3M, Galden products made by Ausimont, etc.). And examples of the pipes [16] material include stainless steel, copper alloys and Inconel. Furthermore, these channel grooves [15] and pipes [16] may also be used as substrate heat sources by passing heated gases (such as air or nitrogen) or liquids (such as water or oil) therethrough in place of coolants.

Figure 18:
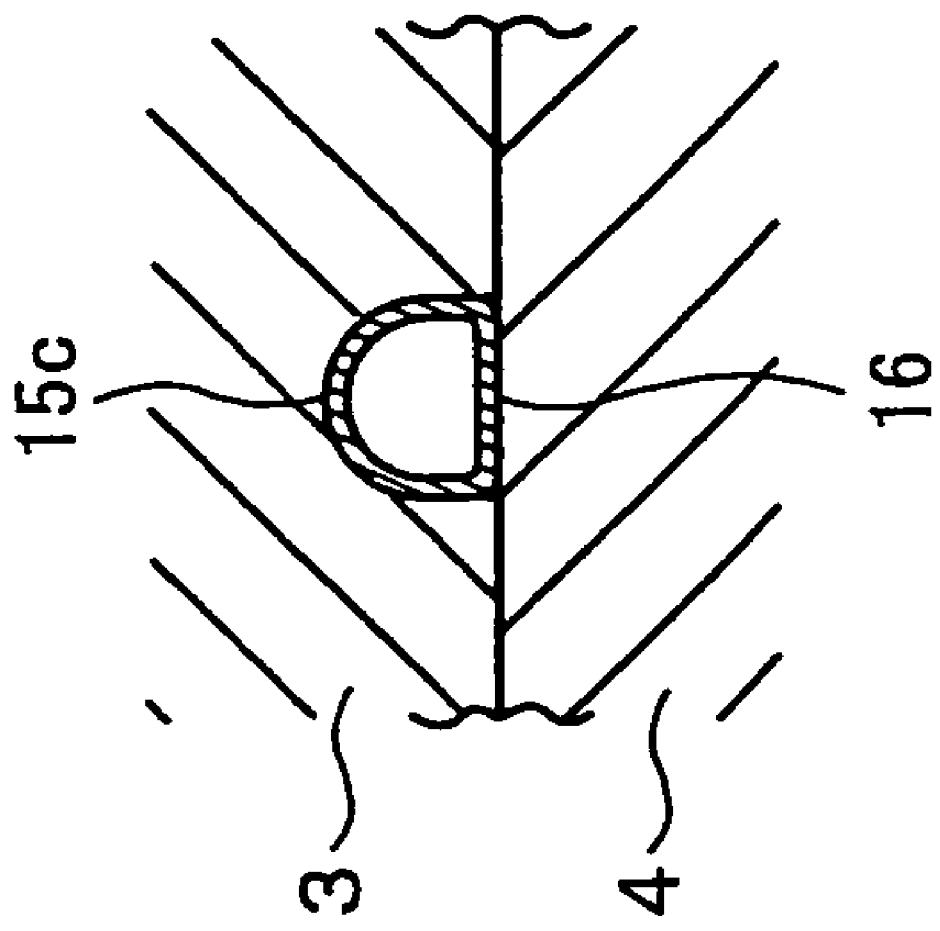
FIG. 18 is an enlarged example of the portion B shown in FIG. 17.

FIG. 17 is an example showing pipes [16] respectively disposed within the following: a groove [15b], having an approximately semicircular cross-section and formed at the position where the two joining surfaces meet; and a groove [15c], having an approximately U-shaped cross-section and formed at the joining surface of the heat transfer plate [3] only. The groove [15c] having an approximately U-shaped cross-section may be formed on either the heat transfer plate [3] or the retainer plate [4], and for this reason it is possible to curb susceptor manufacturing costs compared to the groove [15b] having an approximately semicircular cross-section. Furthermore, the depth of the groove [15c] having an approximately U-shaped cross-section is preferably smaller than the outer diameter of the pipe [16]. In so doing, the pipe [16] is bent inward during caulking, or alternatively, is press fitted into the groove [15c] before caulking such that the upper surface of the pipe [16] is flush with the upper surface of the heat transfer plate [3], as shown in FIG. 18. This enlarges the contact area with the retainer plate [4], thus improving the performance of the susceptor. Additionally, these channel grooves [15] and pipes [16] are connected to an external coolant supply device (not shown in the diagram) by passing through either the heat transfer plate [3] or the retainer plate [4].

Figure 19:
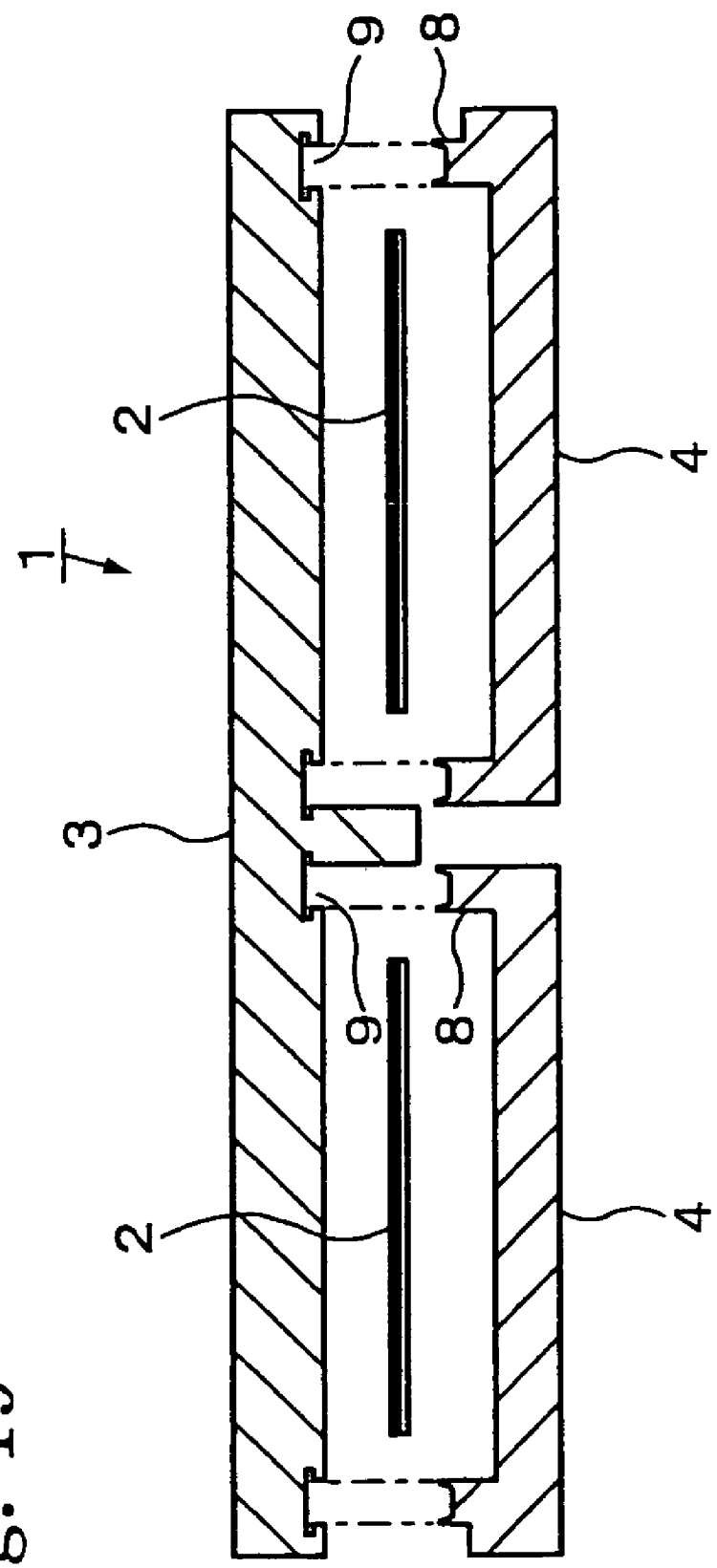
FIG. 19 is a structural end view diagram of an example in which the susceptor comprising the first embodiment of this invention is enlarged.

The invention is not limited to a single protruding part [8] and groove part [9]. For example, in the case of a susceptor used for large semiconductor wafers that are 12 inches or more in diameter, it is preferable to provide additional protruding parts [8] and groove parts [9] in a circular pattern near the center, as shown in FIG. 19. In particular, in the case where a lifter pin is installed for transferring the substrate between the susceptor [1] and a carrier jig, it is preferable to provide protruding parts [8] and groove parts [9] around the periphery of the insertion holes of the lifter pin provided on the susceptor [1].

Figure 20:
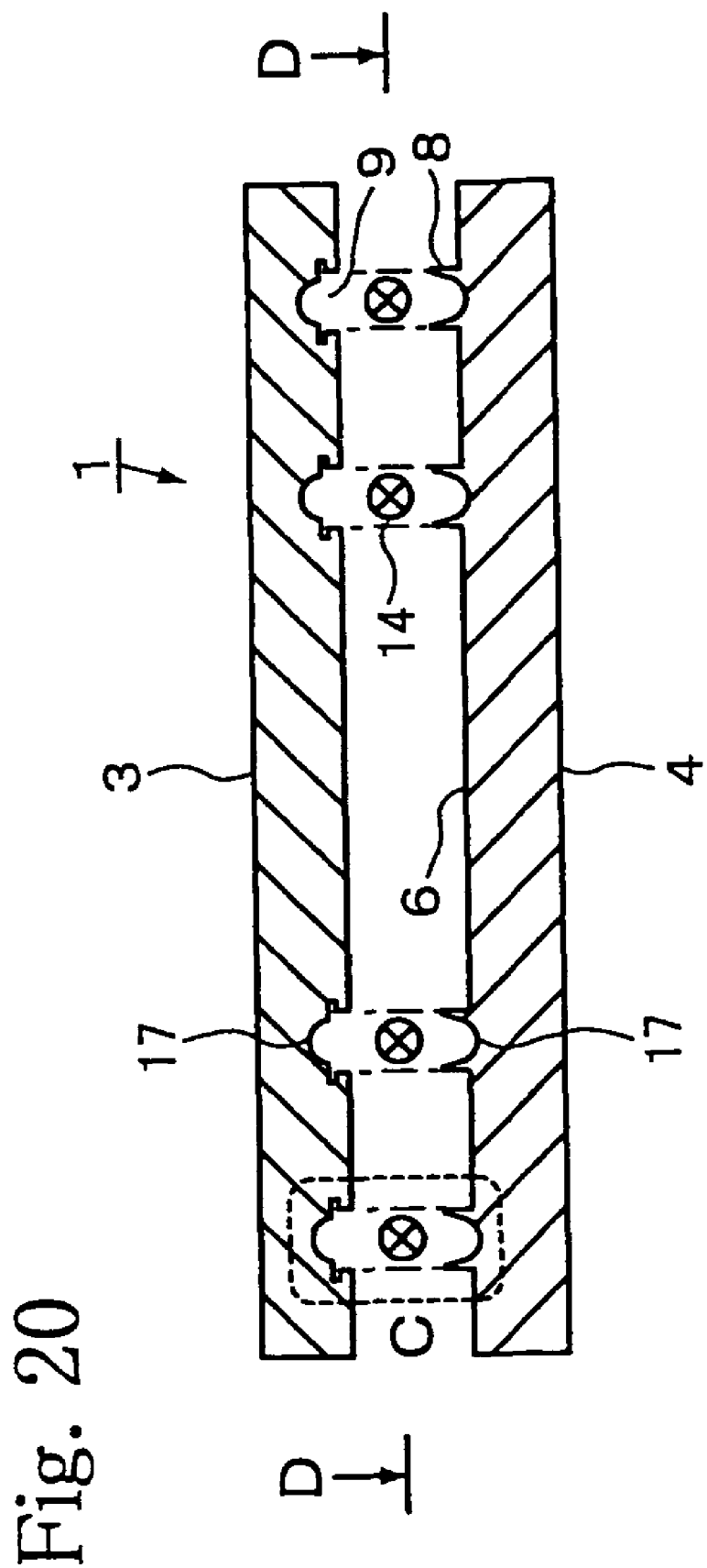
FIG. 20 is a structural end diagram of the susceptor comprising the third embodiment of this invention.

FIG. 20 is a structural end diagram of the susceptor comprising the third embodiment of this invention.

Figure 21:
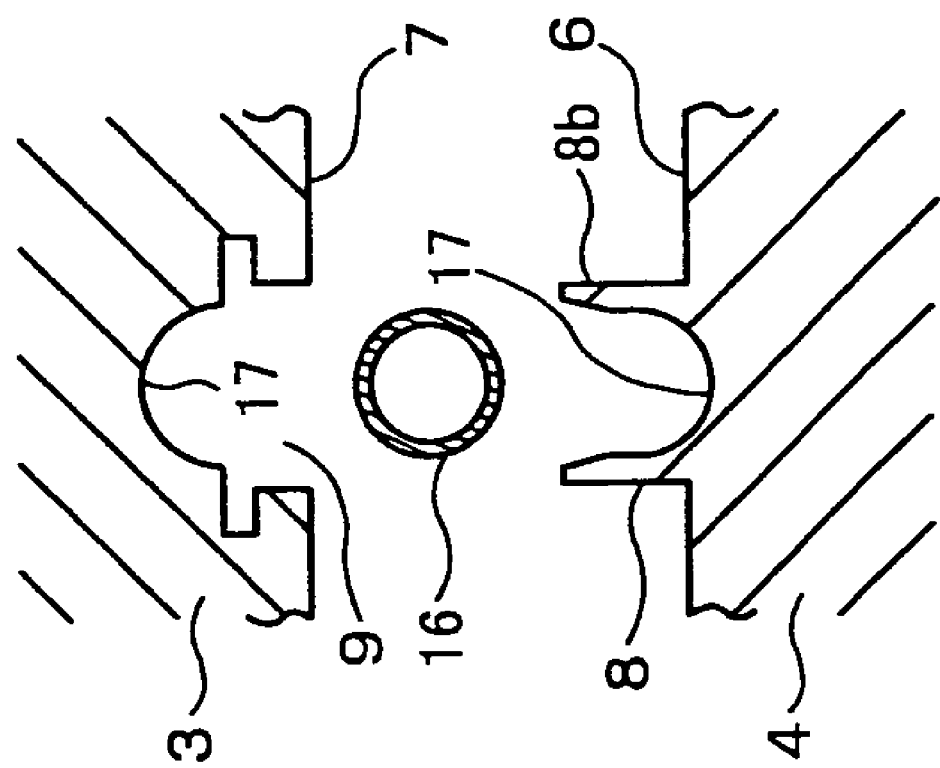
FIG. 21 is an expanded end view diagram of the joining portion C shown in FIG. 19.
Figure 22:
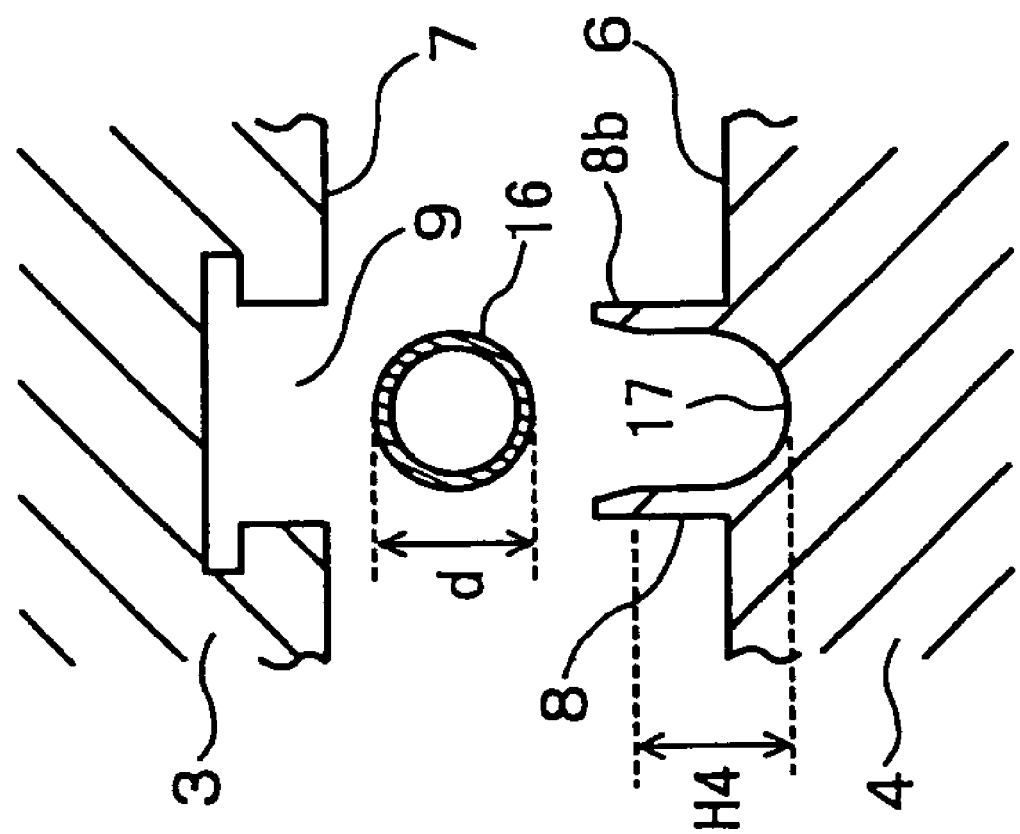
FIG. 22 is an expanded end view diagram of the modification of the joining portion C shown in FIG. 19.
Figure 23:
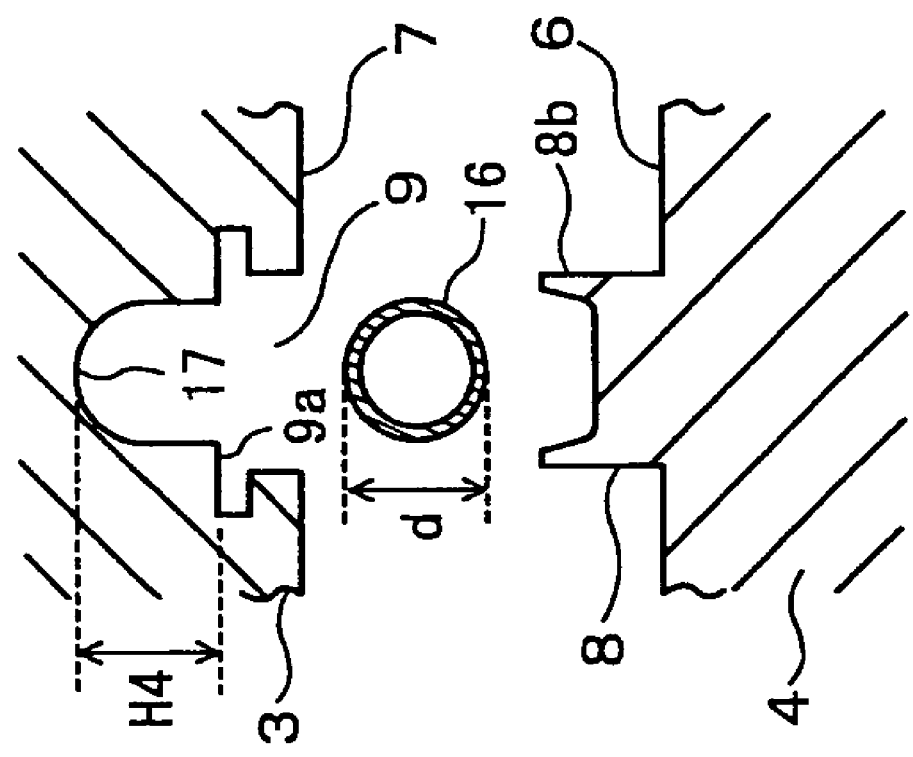
FIG. 23 is an expanded end view diagram of another modification of the joining portion C shown in FIG. 19.
Figure 24:
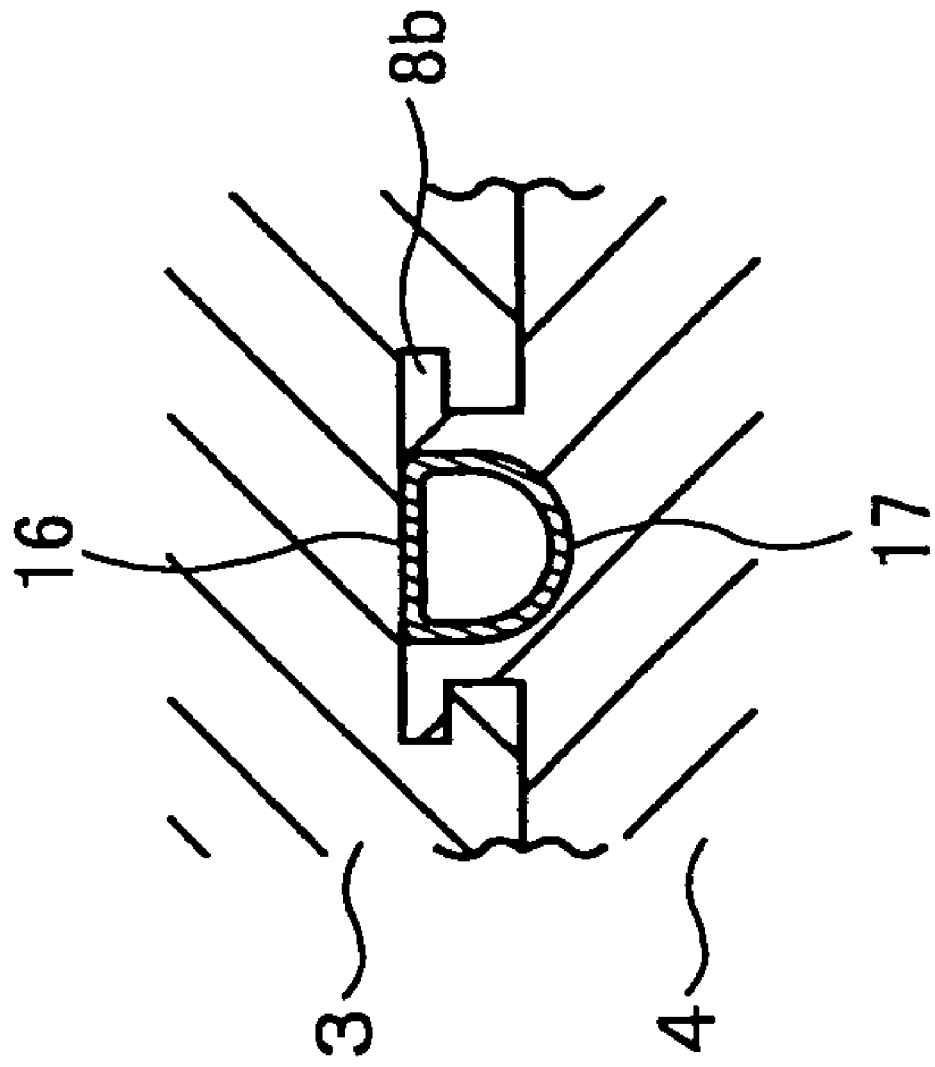
FIG. 24 is an example of an enlarged cross-sectional view of the modification shown in FIG. 22 after caulking.
Figure 25:
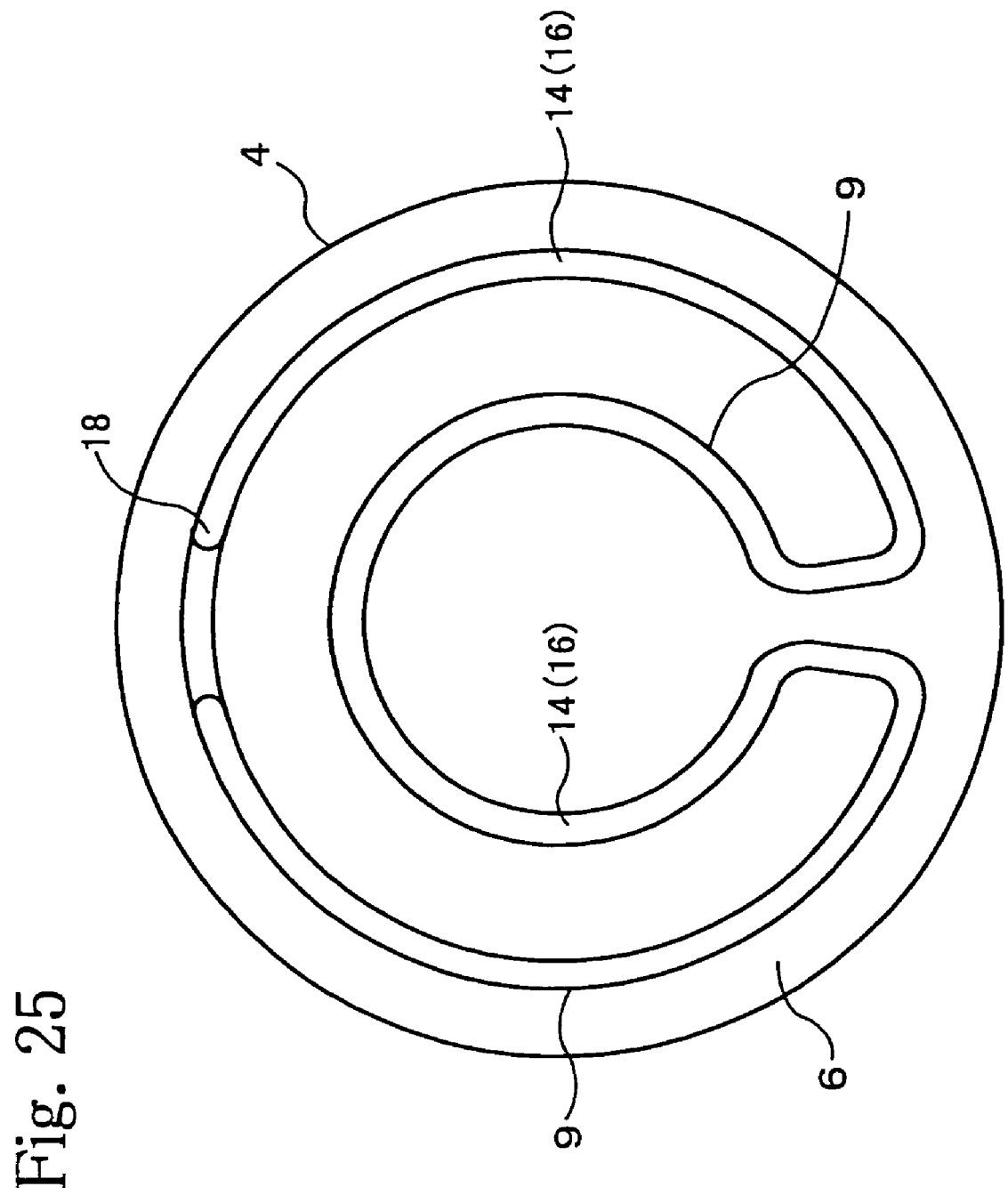
FIG. 25 is a plane view diagram along the line D shown in FIG. 20.
Figure 26:
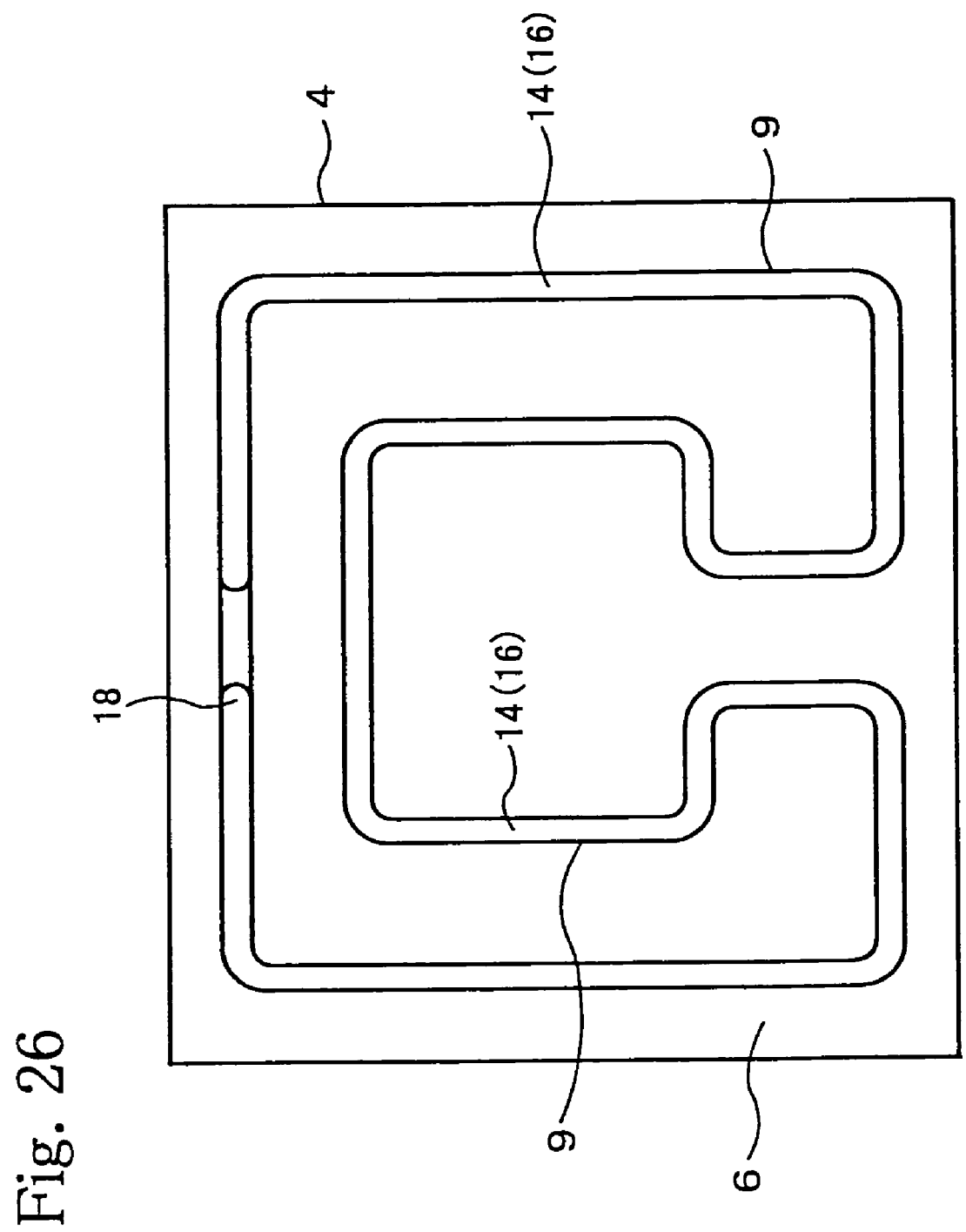
FIG. 26 is a plane view diagram along the line D in the case where the susceptor in FIG. 20 is rectangular.
Figure 27:
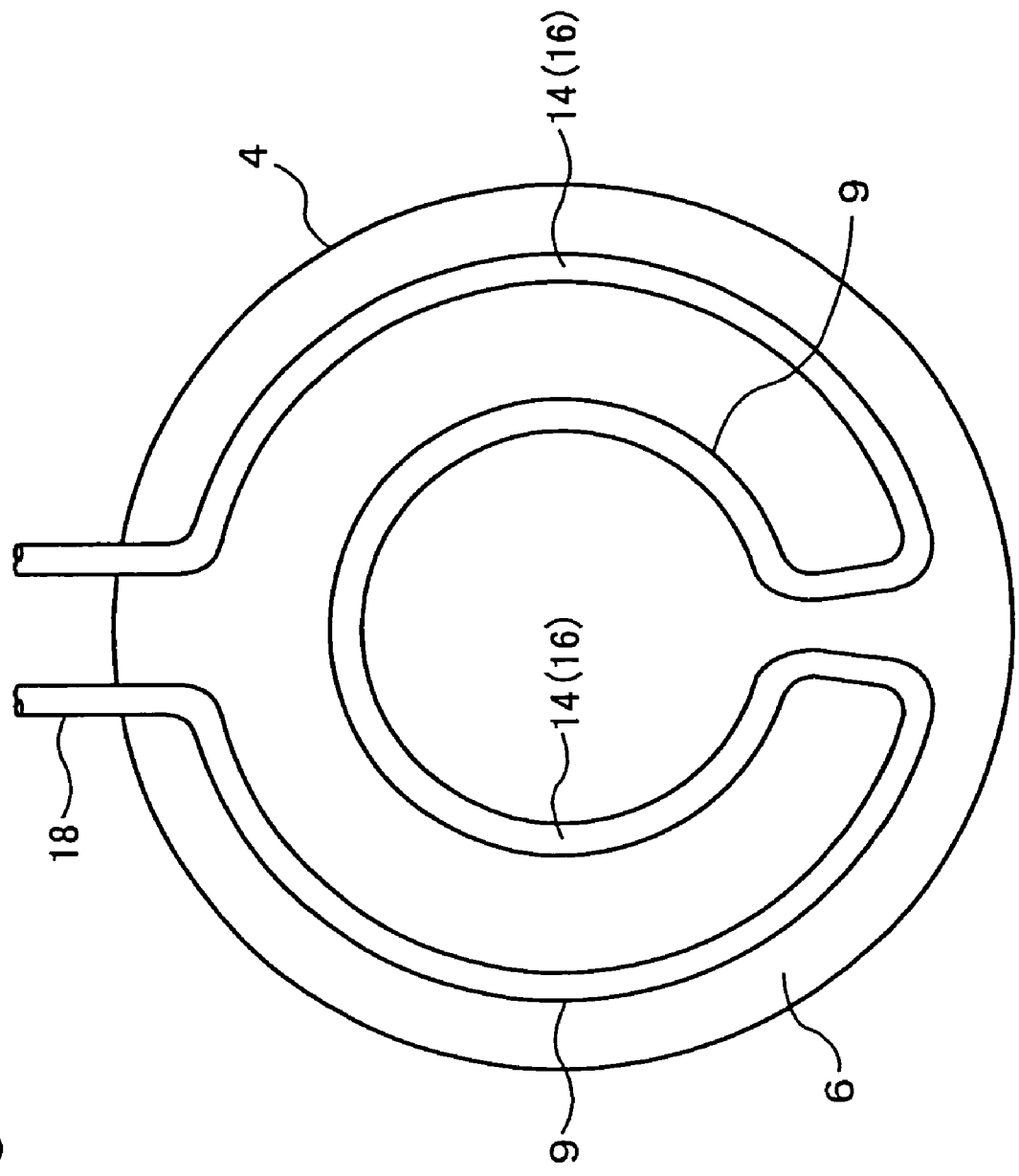
FIG. 27 is a plane view diagram of the modification in FIG. 23.

As shown in FIG. 21, in this embodiment, mounting grooves [17] having an approximately semicircular or U-shaped cross-section are formed on the bottom surface of the concave portion [8a] of the protruding part [8] and the bottom surface [9a] of the groove part [9] at the joining portion [B]. The sheath heater [14] (i.e., a substrate heat source) or the pipe [16] (i.e., a substrate heat source or a substrate cooling source), is installed inside these mounting grooves [17]. As shown in FIG. 22, the mounting groove [17] may be formed only on the bottom of the concave portion [8a] of the protruding part [8] or, as shown in FIG. 23, may be formed only on the bottom surface [9a] of the groove part [9]. Furthermore, with regard to the mounting grooves [17] of FIGS. 22 and 23, for the same reasons as above, it is preferable if the depth [H4] of the groove portion that houses the pipe is smaller than the outer diameter d of the pipe [16], for example as shown in FIG. 24. Doing so enlarges the contact area with the retainer plate [4] after caulking. This type of protruding part [8] and groove part [9] are provided along the sheath heater [14] or the pipe [16] in end-to-end continuous concentric circles as shown in FIG. 25, or in a continuous meandering shape as shown in FIG. 26. Furthermore, the outer connecting portion [18] of the sheath heater [14] or the pipe [16] may also be extended in a direction parallel to the joining surface [6], as shown in FIG. 27.

In this manner, by inserting the sheath heater [14] or pipe [16] between the protruding part [8] and the groove part [9], it is possible to simultaneously conjoin the heat transfer plate [3] and the retainer plate [4] by caulking as well as mount the sheath heater [14] or pipe [16] and improve the airtightness thereof. For this reason, it is possible to simplify the manufacturing process of the susceptor [1] and further cut down manufacturing costs.

Figure 28:
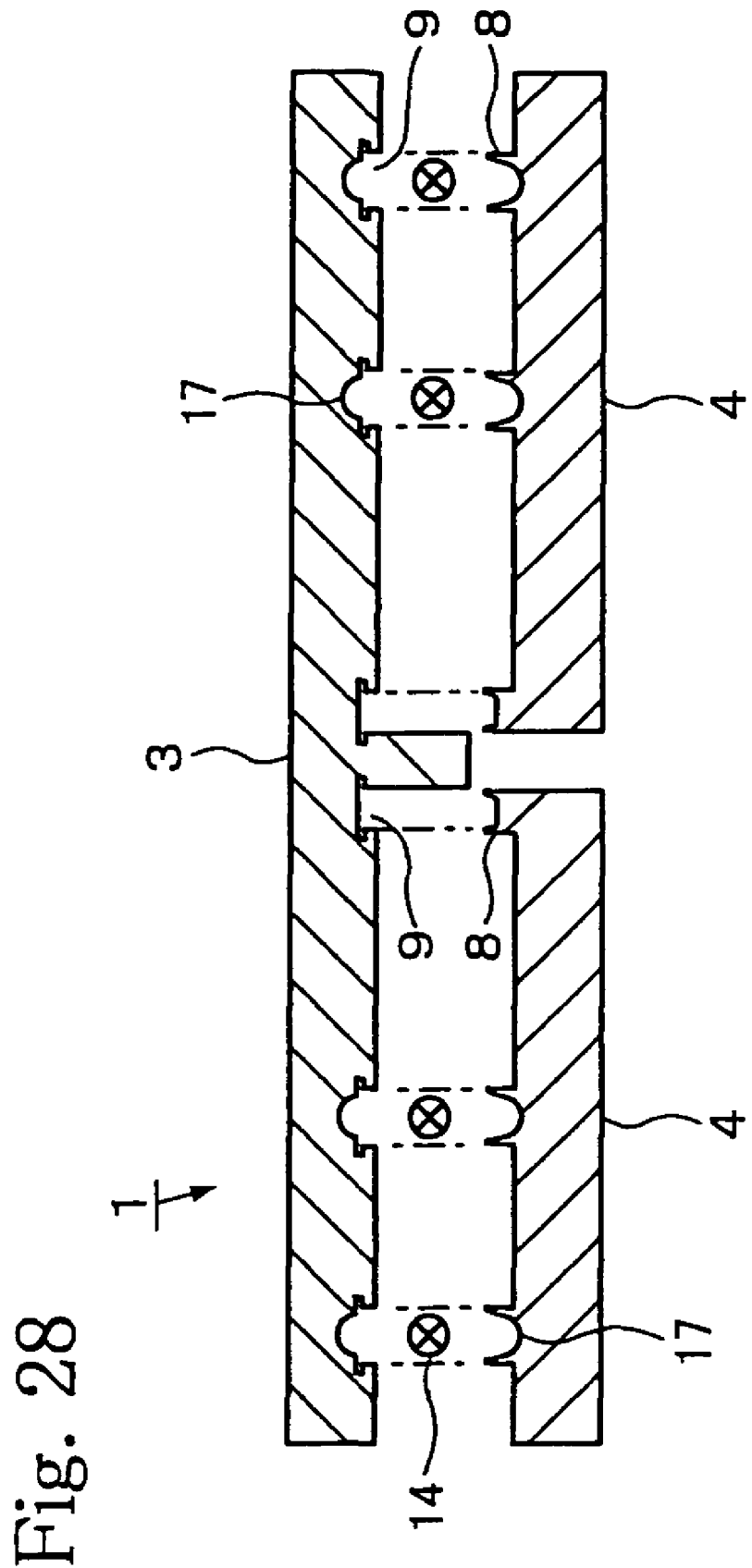
FIG. 28 is a structural end view diagram of the example in which the susceptor comprising the third embodiment of this invention is enlarged.

Furthermore, when this embodiment is applied to a susceptor used for large semiconductor wafers, it is preferable to provide the protruding part [8] and the groove part [9] of the first or second embodiment near the center, as shown in FIG. 28. Doing so improves airtightness.

Figure 29:
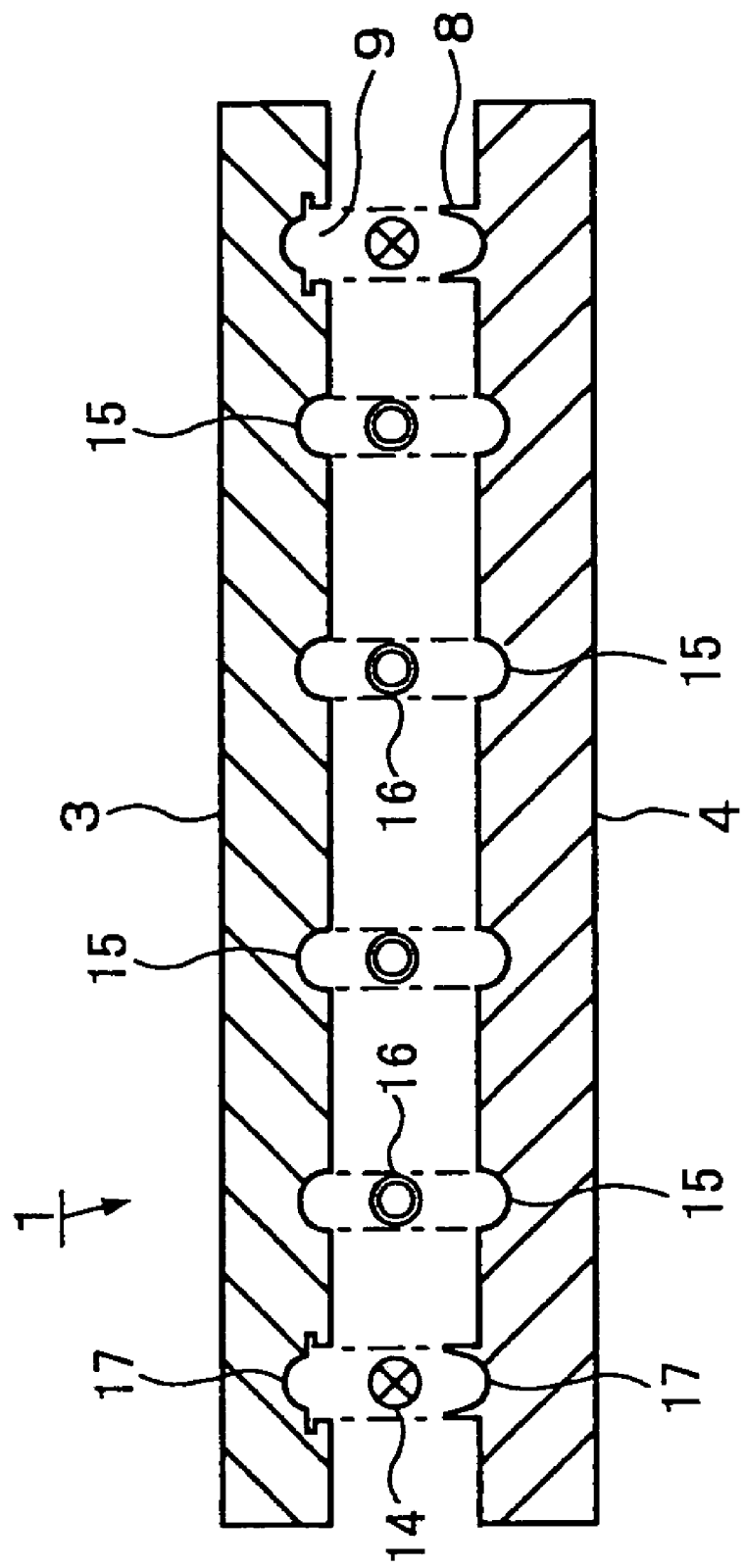
FIG. 29 is a cross-sectional diagram of a modification of the susceptor comprising the third embodiment of this invention.

As a modification of this embodiment, it is possible to structure the susceptor [1] to be simultaneously provided with a substrate heat source and a substrate cooling source. FIG. 29 shows the susceptor [1] configured having a sheath heater [14] inserted between the protruding part [8] and the groove part [9], as well as pipes [16] installed within grooves [15] formed at the joining surface radially inward to the sheath heater [14]. In this manner, when combining a substrate heat source and a substrate cooling source, it is preferable to dispose the substrate heat source, which has large thermal energy loss, on the outer radial side of the heat transfer plate [3], while placing the substrate cooling source on the inner radial side. Doing so improves thermal efficiency.

In Embodiments 1 to 3 explained above, it is of course understood that the protruding part [8] may be provided on the heat transfer plate [3] and the groove part [9] may be provided on the retainer plate [4].

Figure 30:
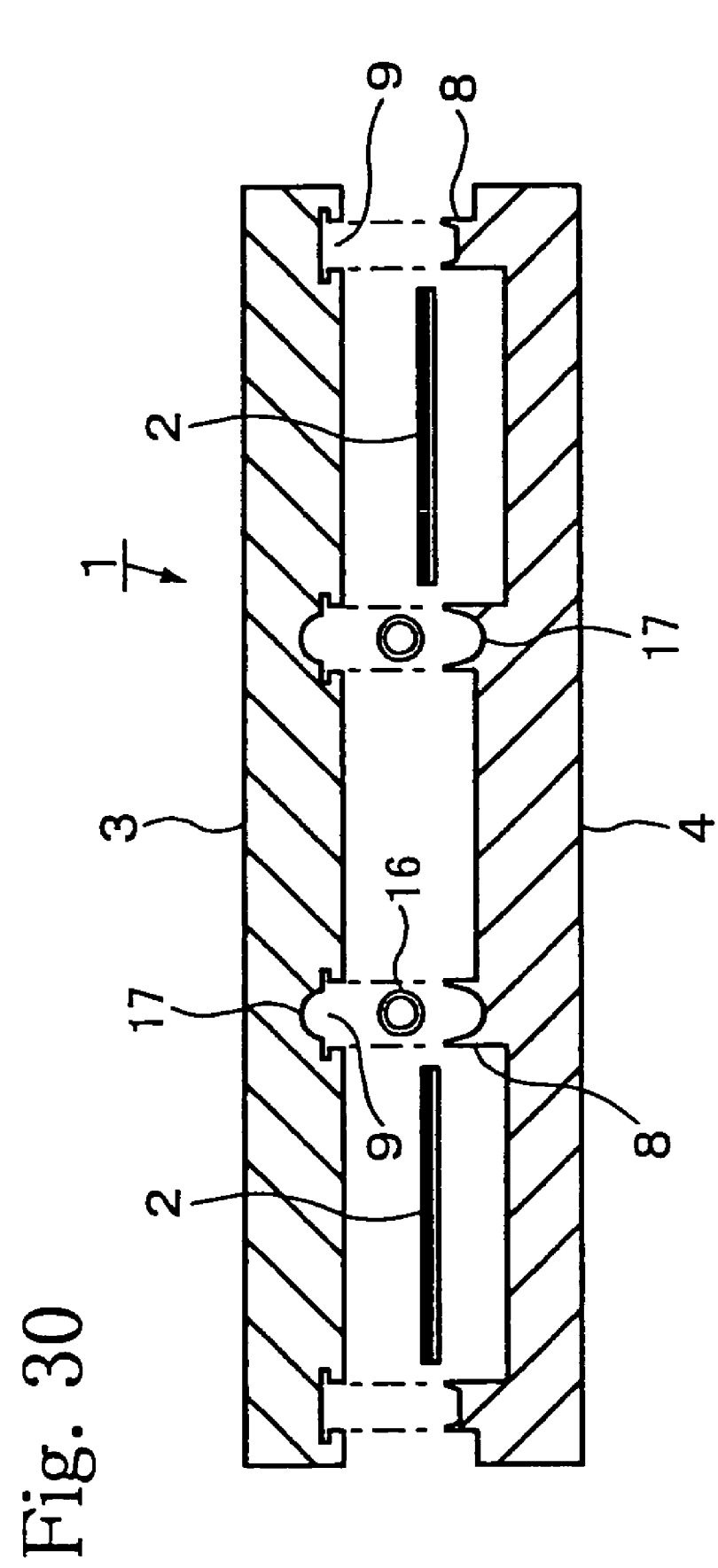
FIG. 30 is a structural end view diagram of an example in which the susceptors comprising the first and third embodiments of this invention are combined.

Furthermore, it is possible to combine the various embodiments to form one susceptor. For example, as shown in FIG. 30, it is possible to form the susceptor [1] by disposing the first embodiment provided with the planar heater [2] on the outer radial side of the heat transfer plate [3], and additionally disposing the third embodiment provided with the pipe [16] on the inner radial side of the heat transfer plate [3].

Figure 31:
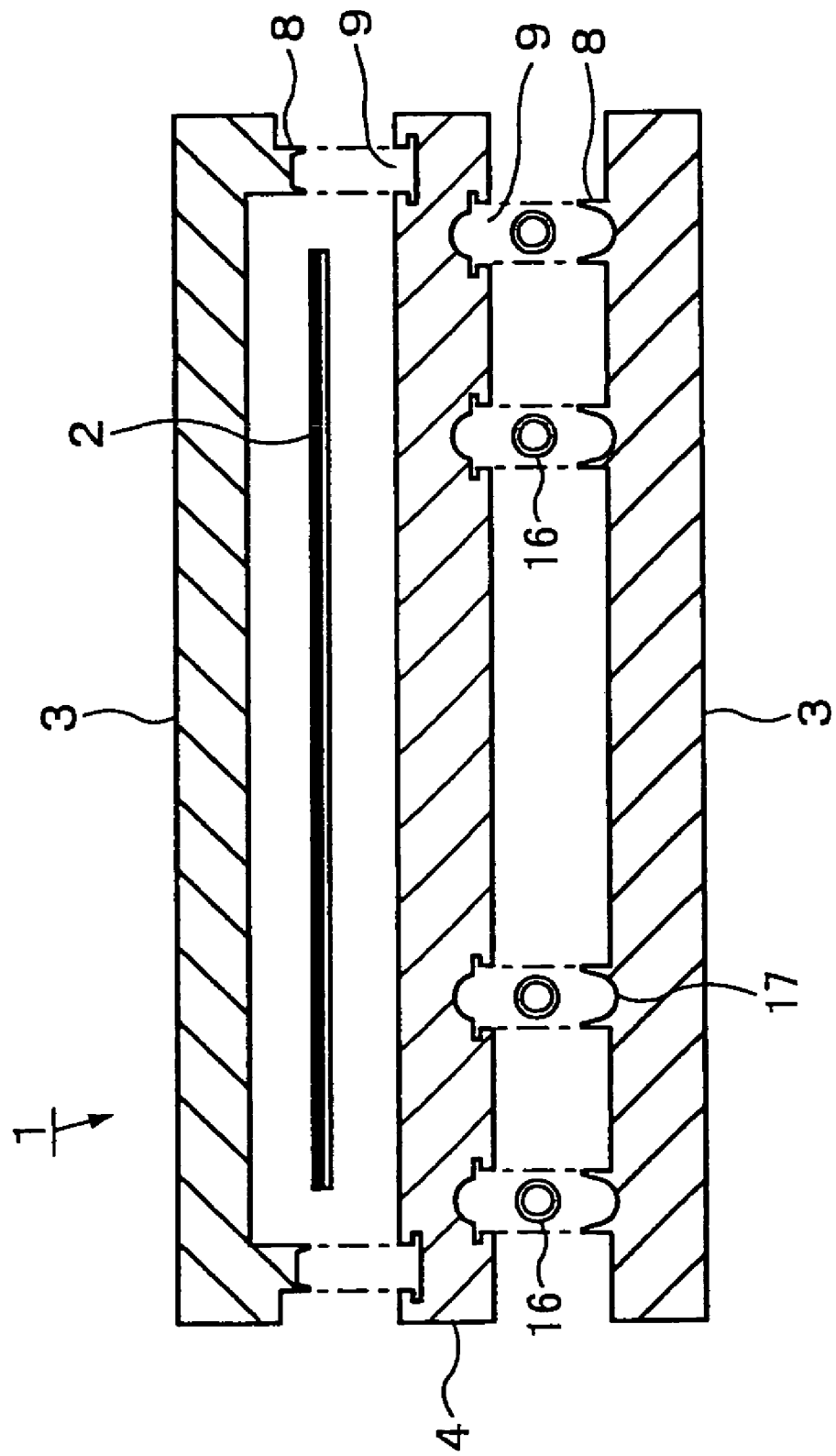
FIG. 31 is a structural end view diagram of an example in which the susceptor comprising the first and third embodiments of this invention is layered.
Figure 32:
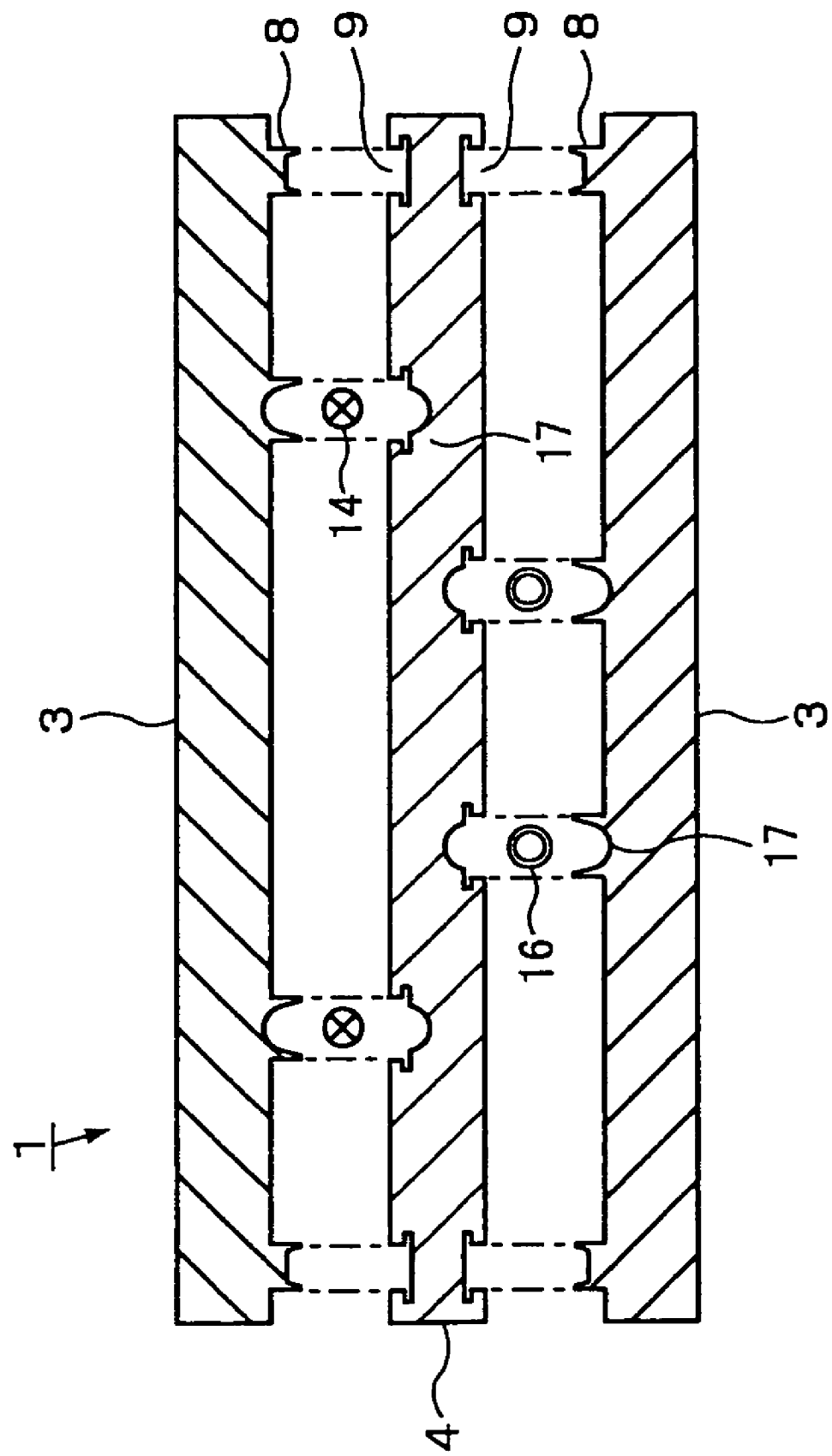
FIG. 32 is a structural end view diagram of an example in which the susceptor comprising the third embodiment of this invention is layered.
Figure 33:
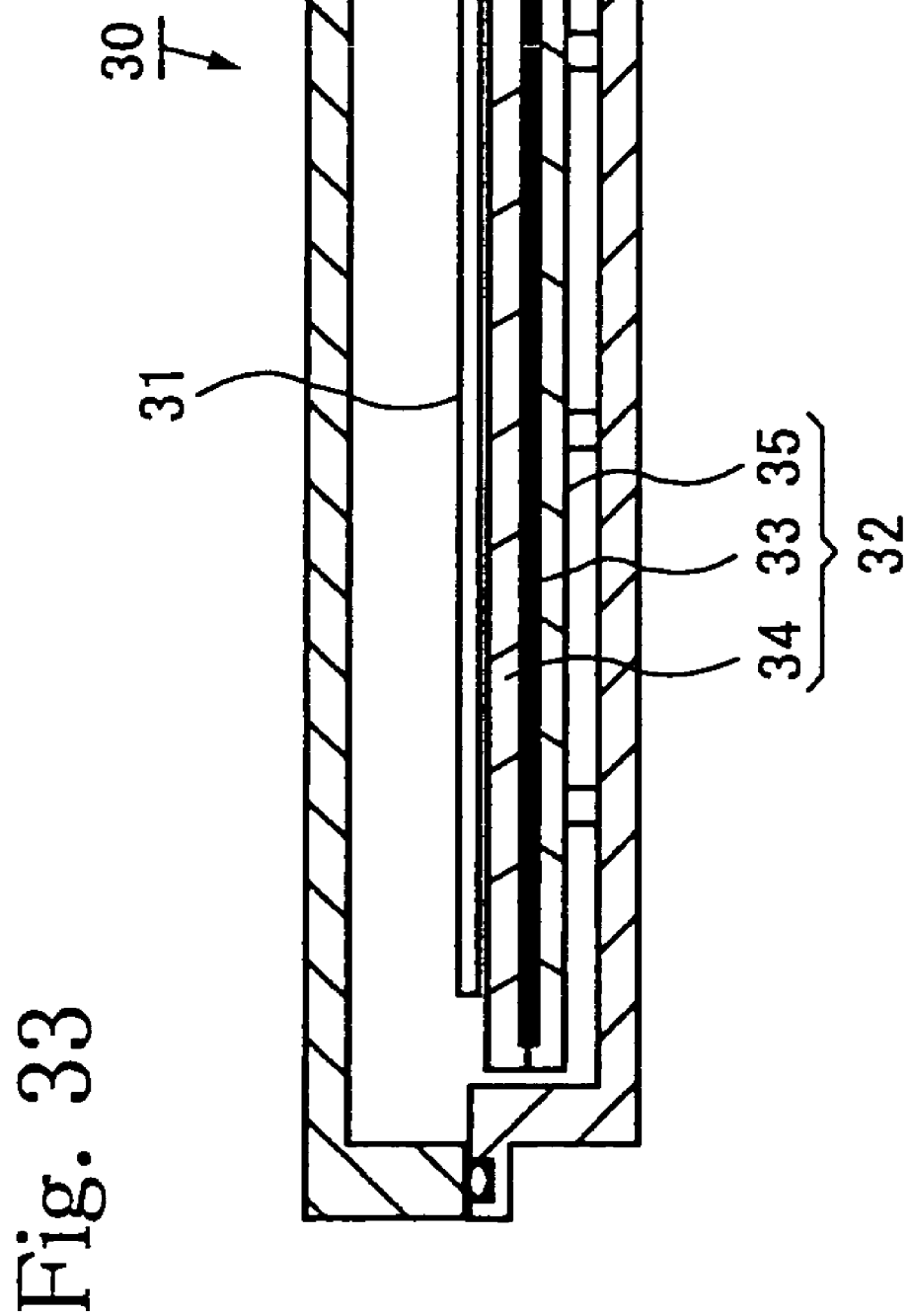
FIG. 33 is a cross-sectional diagram of an example of a substrate heat treatment device with a built-in susceptor.

Additionally, it is also possible to form the susceptor by combining the first to third embodiments in a layered configuration. For example, FIG. 31 shows an example of a susceptor [1] layered in order from the top with the first embodiment (being provided with the planar heater [2]) and the third embodiment (being provided with the pipe [16]), the embodiments sharing a common retainer plate [4]. Similarly, FIG. 32 shows an example of a susceptor [1] layered with the third embodiment provided with the sheath heater [14] and the third embodiment provided with the pipe [16]. In order to improve workability in such cases, it is preferable to form only the groove part [9] (or alternatively the protruding part [8]) on the shared retainer plate [4], while in addition configuring the susceptor such that the groove parts [9] in which the sheath heater [14] and the pipe [16] are inserted are not positioned at the same location in the same radial direction.

By producing a susceptor with these types of layered structures, it is possible to carry out heat treatment over a wide range of temperatures, and it is possible to carry out both heat treatment and cooling using the same susceptor, thereby allowing for improved susceptor performance.

What is claimed is:

1. A susceptor, comprising:
   a first metal plate;
   a second metal plate; and
   substrate heating means or substrate cooling means, inserted and held between the first metal plate and the second metal plate;
   wherein a protruding part, having a concave portion on the upper surface thereof, is provided on a joining surface of the first plate, and notches are formed on the aides of the protruding part at a height corresponding to the bottom of the concave part,
   a groove part composed of a dovetail groove is provided on a joining surface of the second plate so as to face to the protruding part, and
   wherein the first plate and the second plate are conjoined by fitting the protruding part into the groove part and caulking.

2. The susceptor according to claim 1, wherein the cross-section of the groove part is approximately T-shaped or an inverted trapezoidal shape.

3. The susceptor according to claim 1, wherein a convex portion is formed on the bottom surface of the groove part.

4. The susceptor according to claim 1, wherein sealing material is interposed between the protruding part and the groove part.

5. The susceptor according to claim 4, wherein the sealing material is an O ring, or a metal seal.

6. The susceptor according to claim 1, wherein the groove part is provided in a ring on the joining surface, and the substrate heating means is a metal foil heater, a mica-wrapped heater, or a sheath heater installed on an inner side of the protruding part.

7. The susceptor according to claim 1, wherein the groove part is provided in a ring on the joining surface, and the substrate heating means or the substrate cooling means is a groove on an inner aide of the protruding part formed on the joining surface of at least one of the first plate and the second plate, the cross-sectional shape thereof being approximately rectangular, approximately semicircular, or approximately U-shaped, or alternatively, the substrate heating means or the substrate cooling means is a pipe installed within such a groove.

8. The susceptor according to claim 1, wherein a second groove, being approximately, semicircular in cross-section or approximately U-shaped in cross-section, is formed on the bottom surface of the concave portion of the protruding part and/or the bottom surface of the groove part, and wherein the substrate heating means or the substrate cooling means is installed within said second groove.

9. The susceptor according to claim 8, wherein the groove part is provided in a concentric circular shape or a meandering shape, being continuous from end to end.

10. The susceptor according to claim 8, wherein the substrate heating means is a sheath heater or a pipe.

11. The susceptor according to claim 8, wherein the substrate cooling means is a pipe.

12. A susceptor, formed as a layered plurality of susceptors according to claim 1.

* * * * *